(12) United States Patent
Javor et al.

(10) Patent No.: US 11,874,343 B2
(45) Date of Patent: Jan. 16, 2024

(54) SINGLE POINT GRADIOMETER

(71) Applicant: Trustees of Boston University, Boston, MA (US)

(72) Inventors: Joshua Javor, Cambridge, MA (US); David Bishop, Brookline, MA (US); David Campbell, Brookline, MA (US); Matthias Imboden, St. Blaise (CH)

(73) Assignee: Trustees of Boston University, Boston, MA (US)

( * ) Notice: Subject to any disclaimer, the term of this patent is extended or adjusted under 35 U.S.C. 154(b) by 0 days.

(21) Appl. No.: 18/112,229

(22) Filed: Feb. 21, 2023

(65) Prior Publication Data

US 2023/0204690 A1 Jun. 29, 2023

Related U.S. Application Data

(63) Continuation of application No. 17/692,692, filed on Mar. 11, 2022, now Pat. No. 11,614,501.

(60) Provisional application No. 63/300,858, filed on Jan. 19, 2022, provisional application No. 63/300,907, filed on Jan. 19, 2022, provisional application No. 63/159,829, filed on Mar. 11, 2021.

(51) Int. Cl.
*G01R 33/022* (2006.01)
*G01R 33/038* (2006.01)
*G01R 33/00* (2006.01)

(52) U.S. Cl.
CPC ....... *G01R 33/022* (2013.01); *G01R 33/0052* (2013.01); *G01R 33/038* (2013.01); *G01R 33/0385* (2013.01)

(58) Field of Classification Search
CPC ............... G01R 33/00; G01R 33/0035; G01R 33/0023; G01R 33/0017; G01R 31/3191; G01R 33/022; G01B 7/004; G01C 17/38; G06F 3/017; G06F 3/0346; G06F 3/012
See application file for complete search history.

(56) References Cited

U.S. PATENT DOCUMENTS

| | | |
|---|---|---|
| 3,273,397 A | 9/1966 | Forward |
| 4,257,001 A | 3/1981 | Partain et al. |
| 4,368,430 A | 1/1983 | Dale et al. |
| 4,700,135 A | 10/1987 | Hoenig |
| 6,008,641 A | 12/1999 | Penfold et al. |

(Continued)

FOREIGN PATENT DOCUMENTS

CN 113597520 A 11/2021

OTHER PUBLICATIONS

Atomic Magnetometer: Web Page: https://quspin.com/products-qzfm/; 2022.

(Continued)

*Primary Examiner* — Jermele M Hollington
*Assistant Examiner* — Taqi R Nasir
(74) *Attorney, Agent, or Firm* — Burns & Levinson LLP; Steven M. Mills

(57) ABSTRACT

A gradiometer includes a at least one magnet attached to a beam. The magnet moves in response to a magnetic force. A sensing element is configured to measure movement or deflection of the beam or magnet. The gradiometer is configured to determine a gradient of a magnetic field acting on the first magnet based on movement of the magnet. The gradiometer can further measure higher order gradients.

21 Claims, 27 Drawing Sheets

(56) References Cited

U.S. PATENT DOCUMENTS

| | | | |
|---|---|---|---|
| 6,054,856 | A | 4/2000 | Garroway et al. |
| 6,084,495 | A | 7/2000 | Ripingale |
| 6,231,011 | B1 | 5/2001 | Chu et al. |
| 6,268,726 | B1 | 7/2001 | Prammer et al. |
| 6,433,543 | B1 * | 8/2002 | Shahinpoor ........ G01R 33/0327 324/96 |
| 6,462,540 | B1 | 10/2002 | Kandori et al. |
| 7,688,072 | B1 | 3/2010 | Wiegert et al. |
| 8,627,721 | B2 | 1/2014 | Uwechue |
| 2003/0197433 | A1 | 10/2003 | Cheung et al. |
| 2004/0119569 | A1 | 6/2004 | Norimatsu |
| 2005/0057251 | A1 | 3/2005 | Suits et al. |
| 2007/0096729 | A1 | 5/2007 | Brunson et al. |
| 2007/0290678 | A1 | 12/2007 | Herrmann et al. |
| 2009/0293611 | A1 | 12/2009 | Van Kann et al. |
| 2010/0212676 | A1 | 8/2010 | Shapiro |
| 2010/0244819 | A1 | 9/2010 | Johnson et al. |
| 2010/0279374 | A1 | 11/2010 | Sista et al. |
| 2010/0288044 | A1 * | 11/2010 | Meyer ..................... G01V 7/16 73/382 G |
| 2010/0295546 | A1 * | 11/2010 | Walther ............... G01R 33/028 257/E21.211 |
| 2011/0138909 | A1 | 6/2011 | Van Kann |
| 2014/0111154 | A1 | 4/2014 | Roy |
| 2014/0120633 | A1 | 5/2014 | Gandini |
| 2016/0084923 | A1 | 3/2016 | Bai |
| 2016/0216353 | A1 | 7/2016 | Heinen |
| 2017/0176389 | A1 | 6/2017 | Paulson |
| 2017/0200815 | A1 * | 7/2017 | Caldeira .............. H03K 17/687 |
| 2017/0241802 | A1 | 8/2017 | Ausserlechner |
| 2018/0210039 | A1 | 7/2018 | Shalev |
| 2019/0018164 | A1 | 1/2019 | Slocum |
| 2019/0079141 | A1 | 3/2019 | Marauska et al. |
| 2019/0212299 | A1 | 7/2019 | Freear |
| 2019/0242956 | A1 | 8/2019 | Przytarski |
| 2019/0317167 | A1 | 10/2019 | Laborde |
| 2020/0025840 | A1 | 1/2020 | Bickford |
| 2020/0049528 | A1 | 2/2020 | Ausserlechner |
| 2020/0110081 | A1 | 4/2020 | Gandini |
| 2021/0199431 | A1 | 7/2021 | Barbier |

OTHER PUBLICATIONS

Halbach Array: Web Page: https://www.stanfordmagnets.com/everything-you-need-to-know-about-halbach-arrays.html; 2022.

Imboden, et al. "Design of a Casimir-driven parametric amplifier" 2014; Journal of Applied Physics; vol. 116; 12 pages.

International Search Report with Written Opinion dated Mar. 11, 2022 in International Patent Application No. PCT/US2022/019963 filed Jun. 16, 2022; 12 pages.

International Search Report with Written Opinion dated Mar. 11, 2022 in International Patent Application No. PCT/US2022/019966 filed Jun. 16, 2022; 12 pages.

International Search Report with Written Opinion dated Mar. 11, 2022 in International Patent Application No. PCT/US2022/019970 filed Jul. 7, 2022; 17 pages.

Javor, et al. "100 pT/cm single-point MEMS magnetic gradiometer from a commercial accelerometer" 2020; Microsystems & Nanoengineering; vol. 6; No. 71; 13 pages.

Javor, et al. "A Microtissue Platform to Simultaneously Actuate and Detect Mechanical Forces via Non-Contact Magnetic Approach" Feb. 2021; Journal of Microelectromechanical Systems; vol. 30; No. 1; 9 pages.

Javor, et al. "Analysis of a Casimir-driven parametric amplifier with resilience to Casimir pull-in for MEMS single-point magnetic gradiometry" Microsystems & Nanoengineering; vol. 7; No. 73; 11 pages.

Magnetic Gears: Web Page: https://www.kjmagnetics.com/blog.asp?p=magnetic-gear; 2022.

Magnetic Levitation: Web Page: https://www.energy.gov/articles/how-maglev-works; 2022.

Magnetoresistive: Web Page: https://product.tdk.com/en/techlibrary/developing/bio-sensor/index.html; 2022.

SQUID (requires cryogenic chamber): Web Page: https://www.elliotscientific.com/Tristan-Technologies-SQUID-Sensors; 2022.

Stange, et al. "Building a Casimir metrology platform with a commercial MEMS sensor" 2019; Microsystems & Nanoengineering; vol. 5; No. 14; 9 pages.

* cited by examiner

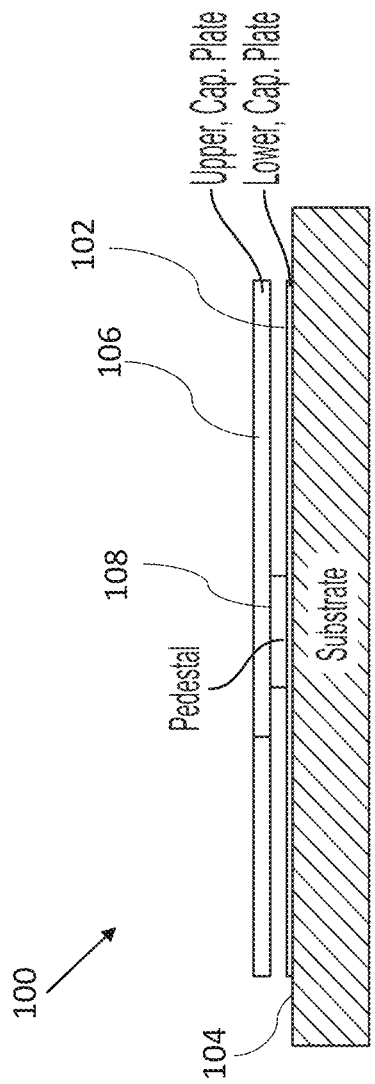
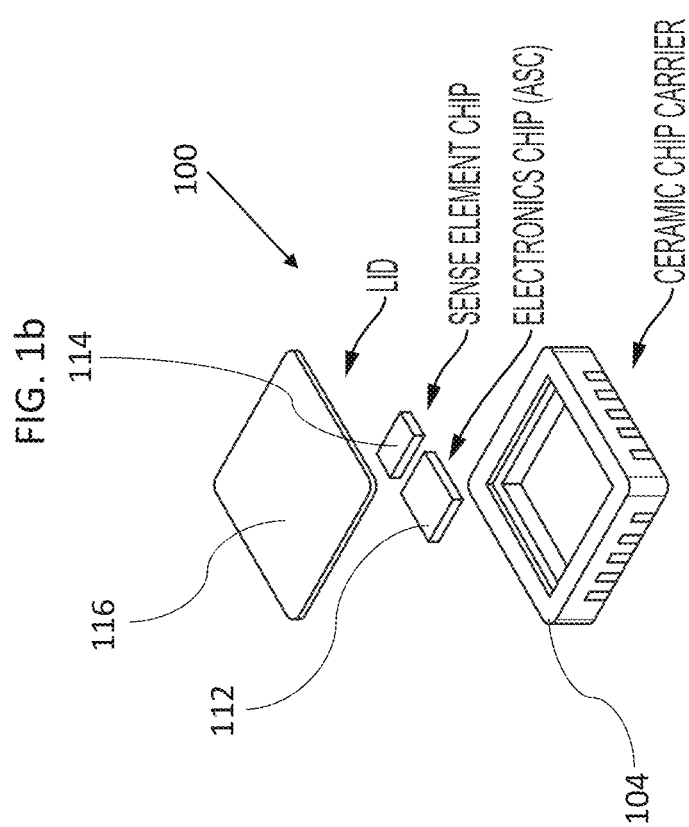

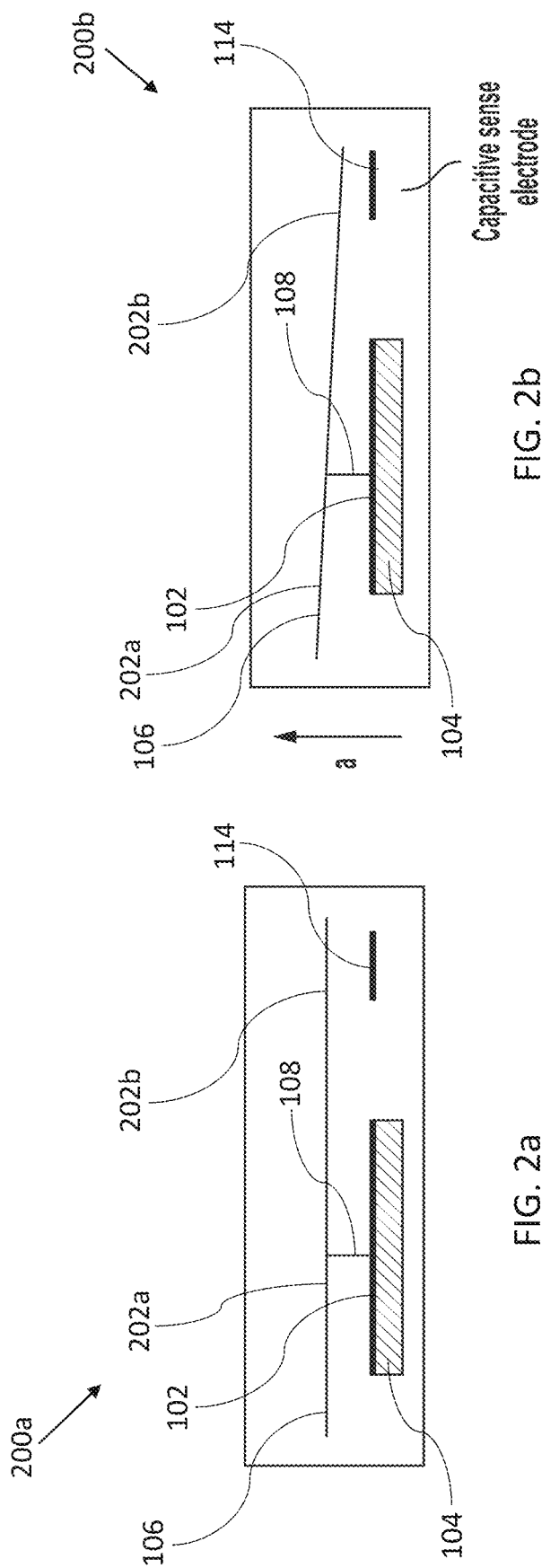

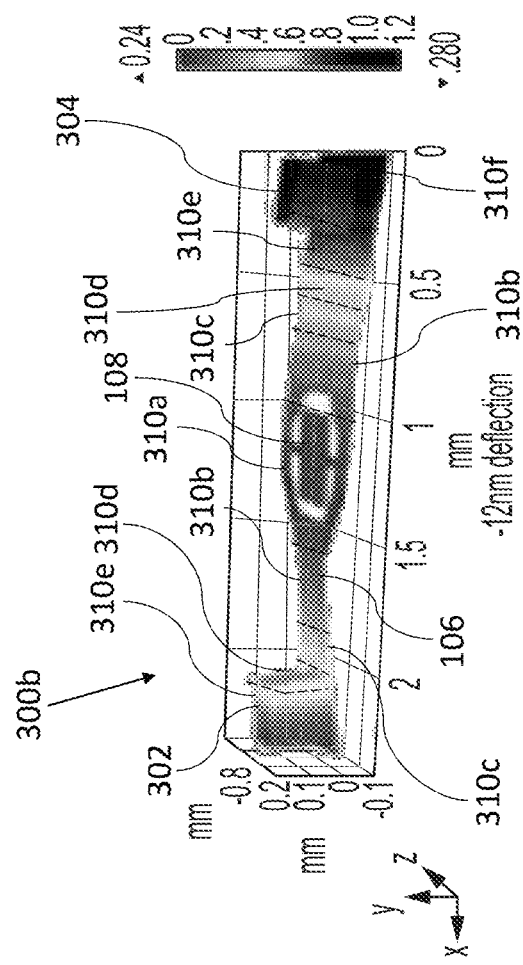
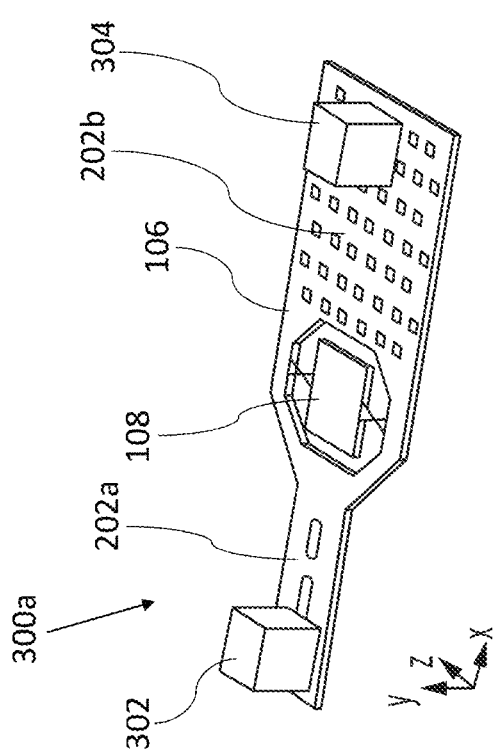
FIG. 3b
FIG. 3a

SINGLE POINT GRADIOMETER

CROSS REFERENCE TO RELATED APPLICATIONS

This application is a continuation of U.S. application Ser. No. 17/692,692, filed on Mar. 11, 2022, and entitled, "SINGLE POINT GRADIOMETER", which claims priority to and the benefit of U.S. Provisional Patent Application No. 63/159,829, filed on Mar. 11, 2021, and entitled "CASIMIR-ENABLED QUANTUM MAGNETOMETER", and U.S. Provisional Patent Application No. 63/300,858, filed Jan. 19, 2022, and entitled "HIGHER ORDER GRADIOMETERS AND USES THEREOF", and U.S. Provisional Patent Application No. 63/300,907, filed on Jan. 19, 2022, and entitled "FIRST ORDER SINGLE-POINT GRADIOMETER (FOG) AND USES THEREOF", the contents of which are incorporated herein by reference as though fully set forth herein.

GOVERNMENT SUPPORT

This invention was supported, in whole or in part, with United States government support under Grant No. 1647837 awarded by the National Science Foundation. The United States Government has certain rights in this invention.

FIELD OF THE TECHNOLOGY

The subject disclosure relates to sensing systems configured to measure forces using gradiometers.

BACKGROUND OF THE TECHNOLOGY

There is a need for more accurate measurements of magnetic fields. Most existing magnetic sensors detect field intensity. Existing sensors include SQUID sensors, atomic magnetometers, and magnetoresistive sensors. These existing sensors that rely on magnetic field intensities suffer from various inaccuracies, as will be discussed in more detail below.

Existing magnetic arrays comprise the arrangement of permanent magnets to create a custom magnetic field profile for many purposes. The most common is for strong holding applications, such as in robotics, manufacturing, or security. Other applications are for levitation, such as in maglev trains. Yet other applications may utilize arrays for noncontact magnetic gears. The technology disclosed herein is unique in that target actuation in not used, but rather the detection of forces on such permanent magnets/arrays, at micro and nano scales.

Electrocardiogram products are ubiquitous. These technologies involve the contact of electrodes with skin to detect voltage potentials. These potentials are proportional to ionic currents generated by the heart during contraction. Such information is used for screening, diagnosis, performance, and more. The most precise and comprehensive product is the Holter monitor, which typically has the most leads. Body surface mapping also exists, but the large number of electrodes is generally impractical for any applications beyond research. Recent trends show miniaturization of such technologies into two-lead patches over the heart. Wearable watches are also entering this space, with limited diagnostic capability. Products with FDA clearance are emerging related to detection of magnetic fields of the heart, improving triage of patients with chest pain and accuracy of diagnosis. Yet, the technology is greatly limited by the necessity for large instruments with magnetic shielding and specialized facilities.

An example of a particular problem is the detection of magnetic fields of the heart. Products with FDA clearance are already emerging in this space, improving triage of patients with chest pain and accuracy of diagnosis. Yet, the technology is greatly limited by the necessity for large instruments with magnetic shielding and specialized facilities. Our technology has the potential to enable miniaturized magnetic sensing in portable and wearable equipment, democratizing such technology.

SUMMARY OF THE TECHNOLOGY

In brief summary, the systems and methods discussed herein relate to sensing of sensitive magnetic fields with enhanced immunity from magnetic interference. All of today's magnetic sensors detect magnetic intensity, which means they are sensitive to all forms of interference, such as the Earth's magnetic field and expansive electromagnetic infrastructure. A large span of techniques have been developed to increase immunity to interference, such as differential sensing with multiple sensors, cryogenic cooling, large magnetically shielded rooms, common mode rejection electronics, and more. The subject technology disclosed herein enables the measurement of sensitive magnetic fields at a single point, with a single sensor, which have increased immunity to magnetic interference. This is achieved by the direct detection of spatial derivatives of the magnetic field, where a sensor becomes more sensitive to objects in close proximity, and far less sensitive to sources that are farther away.

In at least one aspect, the subject technology relates to a gradiometer including a beam. A first magnet is attached to the beam and configured to move in response to a magnetic force. A sensing element is configured to measure movement of the first magnet or the beam. The gradiometer is configured to determine a gradient of a magnetic field acting on the first magnet based on movement of the first magnet.

In some embodiments, the gradiometer is configured to measure a change in the gradient of the magnetic field. In some cases, the change in the gradient of the magnetic field is a higher-than-second order gradient. In some embodiments, a second magnet is mechanically coupled to the first magnet and aligned along a polarization axis, the first magnet and the second magnet being positioned such that a pair of like magnetic poles of the first magnet and the second magnet are adjacent, wherein the first magnet and the second magnet are configured to move along the polarization axis in response to the magnetic field.

In some cases, the gradiometer includes a first non-magnetic element driven at a first resonance frequency along an axis of the beam and a second non-magnetic element attached to the first magnet and driven at a second resonance frequency along the axis. The first non-magnetic element and the second non-magnetic element are coupled by a force along the axis, in resonance. The gradiometer is configured to determine a gradient magnetic field acting on one or more of the first non-magnetic element and magnet based on change in at least one resonance characteristic. In some embodiments, the first non-magnetic element is a sphere, the second non-magnetic element is a plate, and the plate has an attractive force to the sphere. In some cases, the attractive force is a Casimir force and the second resonance frequency is twice the first resonance frequency.

In at least one aspect, the subject technology relates to a gradiometer with a beam. A pedestal mechanically couples the beam to a substrate such that the beam pivots with respect to the pedestal, the substrate being fixed. A first magnet is attached to a first side of the beam and configured to cause the beam to pivot around the pedestal in response to a magnetic force. A sensing element is configured to measure a deflection of the beam. The gradiometer is configured to determine a gradient of a magnetic field acting on the first magnet based on the deflection of the beam.

In some embodiments, the sensing element is positioned along a shared axis with the magnet and offset from the magnet. In some cases, the beam extends generally in a plane, and the sensing element is configured to measure deflection of the beam in a direction orthogonal to the plane. The gradiometer can include a second magnet positioned on a second side of the beam, the second side being opposite the first side of the beam with respect to the pedestal. A polar orientation of the second magnet with respect to the beam can be opposite a polar orientation of the first magnet with respect to the beam.

In some embodiments, at least one additional magnet is positioned on the first side of the beam adjacent the first magnet. The gradiometer can be configured to measure a change in the gradient of the magnetic field. The change in the gradient of the magnetic field can be a second order gradient, or a higher-than-second order gradient. In some embodiments, one additional magnet is aligned with the first magnet along the shared axis and attached to the first magnet at like magnetic poles.

BRIEF DESCRIPTION OF THE DRAWINGS

So that those having ordinary skill in the art to which the disclosed system pertains will more readily understand how to make and use the same, reference may be had to the following drawings.

FIG. 1b is a front view of the sensor of FIG. 1a.

FIG. 1c is an exploded view of the sensor of FIG. 1a.

FIGS. 2a, 2b are functional block diagrams showing operation of the sensor of FIG. 1a.

FIG. 3a is a perspective view of sensor in accordance with the subject technology.

FIGS. 3b, 3c, 3d are diagrams of the deflection of the sensor of FIG. 3a in response to force.

DETAILED DESCRIPTION

Figure 1A:
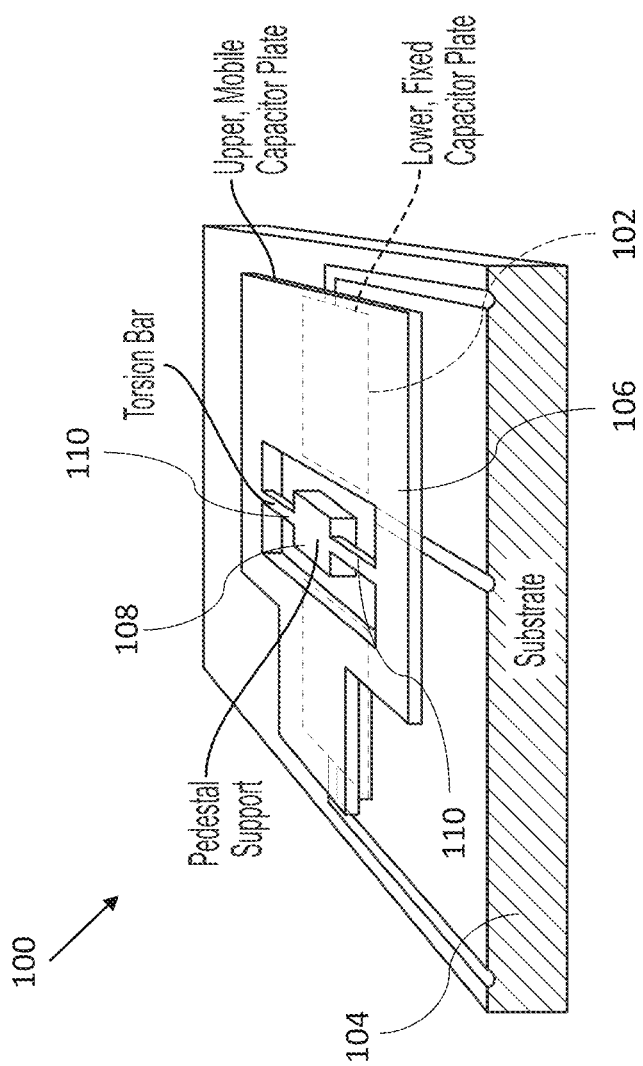
FIG. 1a is perspective view of a MEMS sensing platform in accordance with the subject technology.

The advantages, and other features of the systems and methods disclosed herein, will become more readily apparent to those having ordinary skill in the art from the following detailed description of certain preferred embodiments taken in conjunction with the drawings which set forth representative embodiments of the present invention. Like reference numerals are used herein to denote like parts. Further, words denoting orientation such as "upper", "lower", "distal", and "proximate" are merely used to help describe the location of components with respect to one another. For example, an "upper" surface of a part is merely meant to describe a surface that is separate from the "lower" surface of that same part. No words denoting orientation are used to describe an absolute orientation (i.e., where an "upper" part must always at a higher elevation).

Magnetic sensing applications are ubiquitous, especially for high resolution sensors. These applications span medical to consumer, to industrial. In the medical space, leading applications may be in cardiac and cancer imaging. For those applications, the subject technology provides an array of sensors which produce an image of magnetic fields without contact with the patient. In the cardiac case, the magnetic fields describe ionic currents of the heart, analogous to EKGs, but with 3D information and gathered without contact. For cancer imaging, the magnetic fields describe the activity of injected nanoparticles, which identify solid cancerous tumor margins for the purpose of staging and surgically removing cancerous tissue.

In consumer products, iPhones, automobiles, laptops, and the like all contain magnetic sensors. The technology disclosed herein is compatible with semiconductor processes, allowing for integration in those devices. The disclosed sensors may replace existing sensors in some cases, and in other cases may supplement them. The latter is possible as the sensors disclosed herein are directly sensing gradient and higher order gradient magnetic fields, rather than field intensities. This provides valuable information with reduced interference that may aid in enhanced measurement precision in such devices. Measurements may be targeting the Earth's field, rotary components, proximity to magnetic/ferromagnetic components, battery health, or other systems which can be measured through gradients of magnetic fields.

In brief summary, the technology disclosed herein builds upon our work related to single-point gradiometers that selectively measure the first order spatial gradient of a magnetic field. Herein we describe designs and rationale for the measurement of first order gradients using different MEMS designs that pose several advantages to prior sensing approaches. We support this disclosure with fabrication methods, a measurement system, and results demonstrating proof-of-concept sensitivity to magnetic fields. The benefits described for first order gradiometers are enhanced in these designs: simpler fabrication techniques, greater immunity to noise and interference, and a lower intrinsic sensitivity. The greatest benefit that this class of gradiometers offers to sensitive magnetometry is unshielded sensing in ambient environments, a direct product of immunity to magnetic interference. Additionally, systems are disclosed which utilize higher order (i.e. second order or higher) gradiometers and Casimir coupled gradiometers.

The systems and devices disclosed herein could advantageously be employed in many industries, including in the health care space for applications such as heart beat monitoring. MEMS companies are increasingly getting involved in the healthcare space. While previous business models surrounded around becoming a ubiquitous component in many types of devices, models for healthcare are different such that these companies target vertical integration and the selling of a comprehensive product, rather than a component.

Referring now to FIGS. 1a-1c, an exemplary MEMS platform 100 for measuring magnetic field gradients (i.e. a gradiometer) is shown. The platform 100 includes a lower capacitor plate 102 which is fixed (not movable) via attachment to a substrate 104, which can be a chip carrier or the like. The lower capacitor plate 102 is attached to an offset beam 106 (which can be an upper capacitor plate) which is mobile. The connection between lower capacitor plate 102 and beam 106 is accomplished via a support pedestal 108 and torsion bars 110. The pedestal 108 connects directly to the lower capacitor plate 104, while the torsional bars 110 connect between the beam 106 and the pedestal 108 and enable movement between the beam 106 and lower capacitor plate 102.

The platform 100 includes an electronics chip 112, which can be an ASIC or the like. The electronics chip 112 can be configured to carry out all processing functions of the platform 100. A sense element 114 is included for measuring a gradient magnetic force. In some cases, the sense element 114 can be a capacitive sense electrode. The sense element 114 can be fixed to the substrate 104 and/or lower capacitor plate 102 to measure the gradient magnetic field in response to movement of the beam 106. A protective lid 116 can be attached to the substrate 104 to close the platform 100. The lid 116 is designed to be easily removed, for example, through application of heat. To that end, in some cases the lid 116 can be removed by placing the platform 100 upside down on 400 Celsius hot plate for about 30 s. The platform 100 can include a pin connector, or other means to connect the platform 100 to a power source and/or other external electronics.

In some examples discussed herein, two devices have been experimentally tested-one with a 500 μm magnet and one with a 250 μm magnet, as discussed in more detail below.

Referring now to FIGS. 2a-2b, schematic diagrams 200a, 200b show operation of the MEMS platform 100. Functionally, the capacitor plate 106 can be said to include two sides 202a, 202b (generally 202), divided by, and designed to flex around, a plane formed by the pedestal 108 and torsional bars 110 (causing deflection in a plane of the beam). Diagram 200a depicts the platform 100 in a neutral position, with no acceleration. Diagram 200b depicts the platform 100 when accelerating, causing one side 202a to move upwards (in the orientation depicted in the figure) while the second side 202b moves downwards. When accelerated, the more massive side 202b of the beam tilts toward the sensing element 114, resulting in an increased output voltage which can be passed to the electronics chip 112. This provides a one-dimensional accelerometer, or gradiometer. Notably, while these diagrams show primary functional features of the platform 100, it should be understood that the platform 100 can include many additional components, for example, to minimize the effects of temperature and enable differential measurements.

This MEMS sensing technology can be described like a 'seesaw' or 'teeter totter' method. One side 202b of the seesaw has larger mass than the other (202a) and so torsional deflection occurs during acceleration. The beam 106 is long enough that the tip of the beam 106 can be approximated as linear deflection, rather than torsion. So magnetic functionalization is done here. With proper magnet orientation on the beam 106, as discussed below, the platform 100 is directly sensitive to first order gradient magnetic fields. Moreover, the overarching torsional design increases the immunity of the device to translational mechanical vibrations and out-of-plane translational forces and torsional forces on the magnet. These are not features that were intended for magnetic sensitivity, but are design elements that lend themselves very well to the designs discussed herein.

The MEMS structures have a large gap (on the order of 10 microns) between them and the substrate 104 (or sensing electrode 114) and beam 106. This eases the process of post-release fabrication by about 10-fold compared to prior designs. When functionalizing the device by magnetic assembly, one is trying to avoid stiction, where the MEMS structure contacts the substrate 104 and strong electrostatic forces make it nearly impossible to recover functionality. Furthermore, the MEMS structure is thicker (about 20 μm compared to prior devices that were 1-4 μm). This makes the platform 100 far more robust during fabrication as well as during sensing. Out of plane deflections or destruction of the structure is much less common.

The platform 100 has inherently lower thermo-mechanical noise by design. The limit of detection for accelerations is about 7 microGravities per root Hz. This is about 100× better detection limit than previous devices, which were about 100 uG/rtHz. When functionalized with permanent magnetic material, this is directly proportional to the limit of detection for magnetic fields.

Finally, all of these things are achieved in a package of similar size to previous devices. The package is 8×8×2.5 mm with sensitivity in the 2.5 mm dimension. Previous devices were 5×5×2 mm with sensitivity in the 5 mm dimension. This means that, in principle, one is able to get as close or closer to a magnetic source with this device design, compared to previous devices. Magnetic fields are exponentially larger when one is closer to a source, making this a highly significant feature. In addition, the sensitivity in the perpendicular direction to the lid of the package, enables easier experimentation with Casimir forces, electrostatic forces, and parametric amplification. This is because it is much easier to move in from above rather than from the side on MEMS platform 100. These advantages are also applicable to other sensors discussed herein.

Figure 3C:
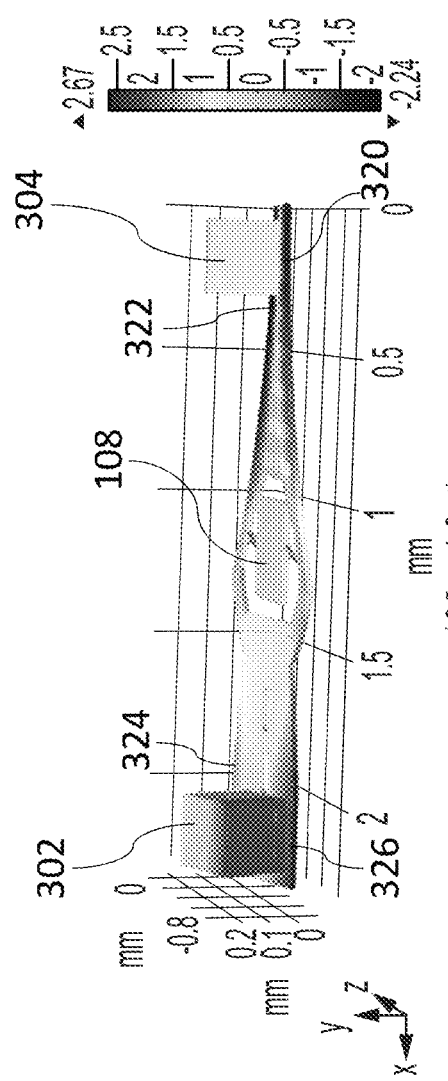
Figure 3D:
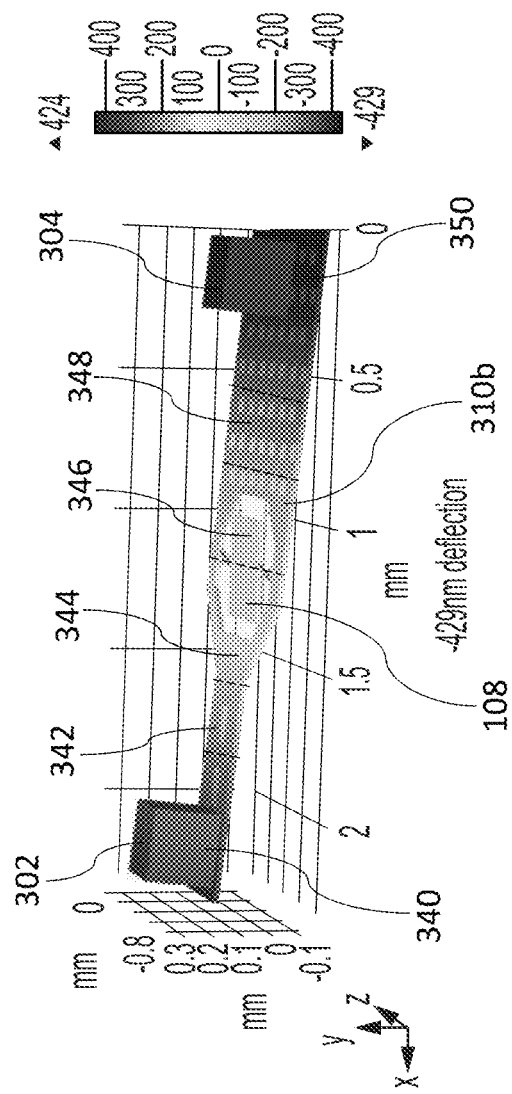

Similar to diagrams 200a, 200b, FIGS. 3a-3d illustrates a perspective views of the MEMS sensor 300a similar to the MEMS platform 100, except that magnets 302, 304 are included. Note that in FIGS. 3a-3d, the magnets' polarization axes are oriented vertically, and they are opposite of each other. These figures show a simulation of a design in accordance with the subject technology, showing how the device reacts to each of the 6 components of a 3D magnetic field which contains gradients (but perhaps no higher order gradients). In summary, FIG. 3d is the most illustrative, as this shows how the device would react to a gradient magnetic field in the direction of the polarization axes of the magnets 302, 304. Furthermore, it shows this is a larger deflection than most of the other components, although we note that there is still comparable sensitivity to the field intensity in the same direction. However, the other figures (FIGS. 3b-3c) demonstrate an insignificant deflection due to other components of the magnetic field. Note that the 3D "flexing" in FIGS. 3b and 3c results in deflections that are <10% compared to any field in the direction of the polarization axis. The bending shown in the figures is exaggerated to illustrate the deflection, but is not representative of the magnitude of the deflection. In the example of FIG. 3a, exemplary magnets 302, 304 are attached to the beam 106, which causes the capacitor plate to flex in response to magnetic force. The resulting deflection of the beam 106 was simulated, with the results illustrated in the images shown in FIGS. 3b-3d. The area of highest deflection is labeled 310a, followed by 310b, 310c, 310d, 310e, and 310f (which is the area of the least deflection experienced). Overall, the total deflection across the beam 106 is about −12 nm in the y-direction between the magnets 302, 304 and the pedestal 108.

FIGS. 3c-3d show the platform 100 experiencing other kinds of force (at 300c, 300d, respectively). While FIG. 3b represents the platform 100 flexing around the z-axis, FIG. 3c shows a twisting along the x-axis. This results in magnets 302, 304 at opposite ends of the beam 106 rotating in opposite directions around the x-axis. The deflection at the near side 326 adjacent the first magnet 302 (∼−2 nm) is similar to deflection at the far side 322 adjacent the second magnet 304. The far side 324 adjacent the first magnet 302 experiences a deflection of just over 1 nm while the near side 320 adjacent the second magnet 304 experiences a deflection of about 2.5 nm. Thus, the maximum deflection is about +/−2.5 nm.

In FIG. 3d, the platform 100 is shown torqued towards one side, representing a decreasing y-axis deflection from the first magnet 302 to the second magnet 304 along the x-axis. In particular, the platform has the most y-axis deflection in region 340, and a decreasing amount of deflection across regions 342, 344, 346, 348, and 350. The final deflection between the pedestal 108 and region 350 of most deflection (adjacent magnet 304) is about −429 nm.

Figure 4C:
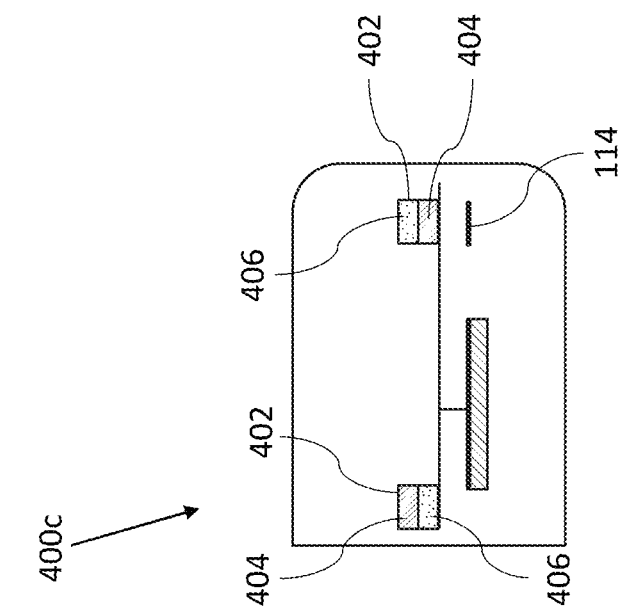
FIGS. 4a, 4b, 4c are schematic diagrams of exemplary arrangements of sensors in accordance with the subject technology.
Figure 4B:
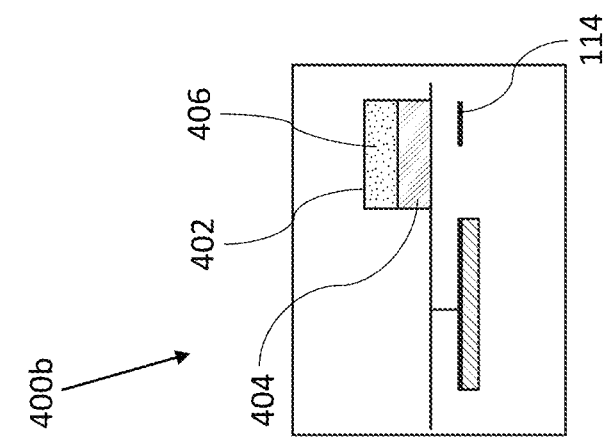
Figure 4A:
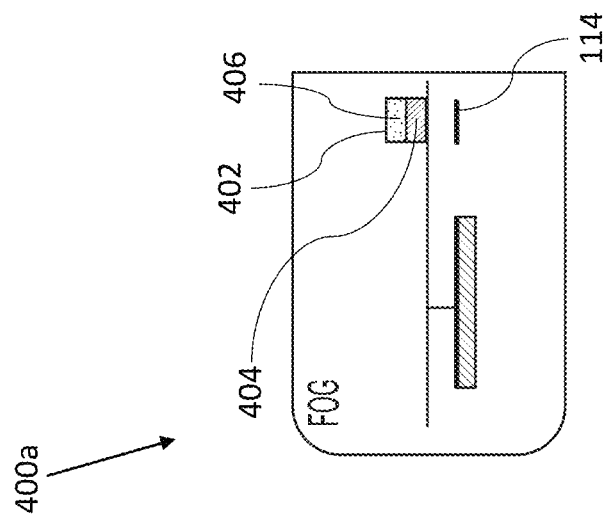

The MEMS platform described above can be configured with various arrangements of magnets on the beam, as will be described in more detail below. Referring now to FIGS. 4a-4c, various exemplary arrangements of magnets 402 within a MEMS sensing platform in accordance with the subject technology are shown. The arrangements 400a, 400b, 400c of magnets shown in FIGS. 4a-4c can be incorporated as part of the MEMS sensing platform 100 (and other sensing platforms not specifically shown), except as otherwise shown and described. In particular, the magnets are shown with various pole orientations, with opposite poles being denoted by reference numerals 404, 406. For example, in some cases, the north pole of the magnet can be 404 and the south pole of the magnet can be 406. However, this is used by way of example only, and it should be understood that the particular poles shown may be swapped in other arrangements.

The first two arrangements 400a, 400b, show an arrangement with a singular magnet (the magnets 402 differing in sizes between the two arrangements 400a, 400b) offset from the sensing element 114. In the arrangement shown in 400c, two magnets 402 are arranged at opposite ends of the capacitor plate 106, and with opposite polarizations adjacent to the beam 106. This allows for a direct measurement of a magnetic field gradient via the net force on the microstructure.

Figure 5A:
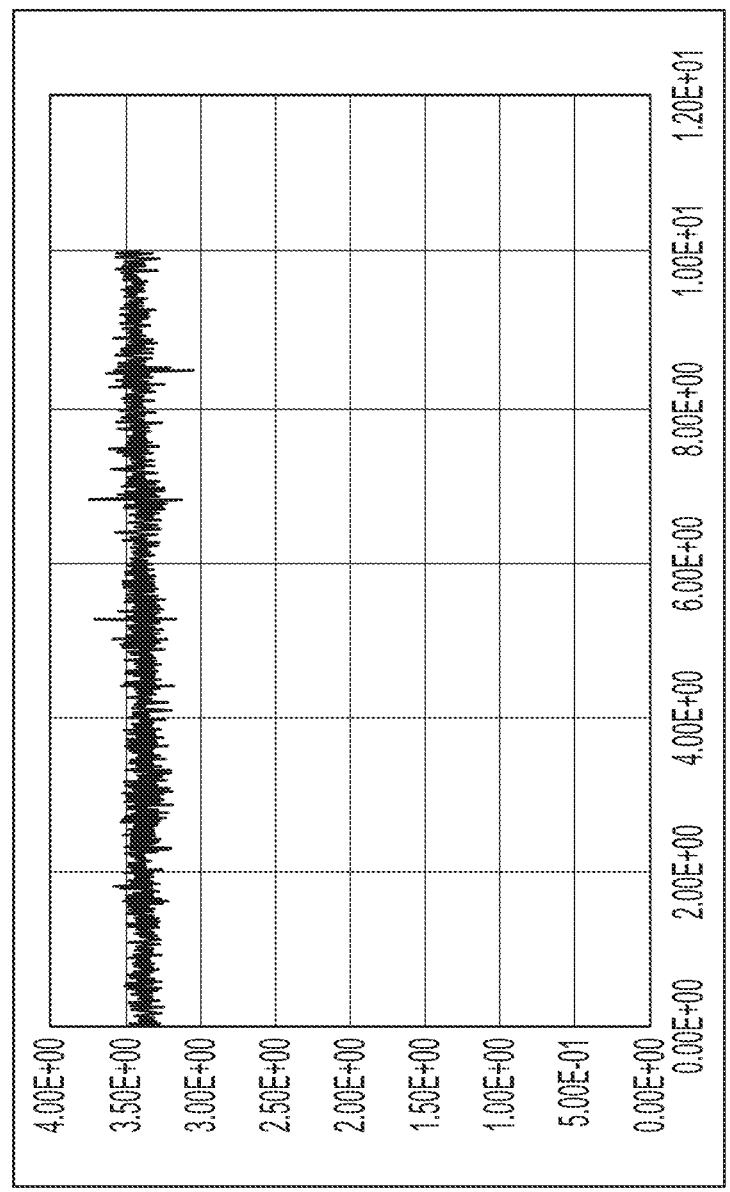
FIGS. 5a, 5b, 5c are graphs of output from a platform with a 250 μm magnet in accordance with the subject technology.
Figure 5B:
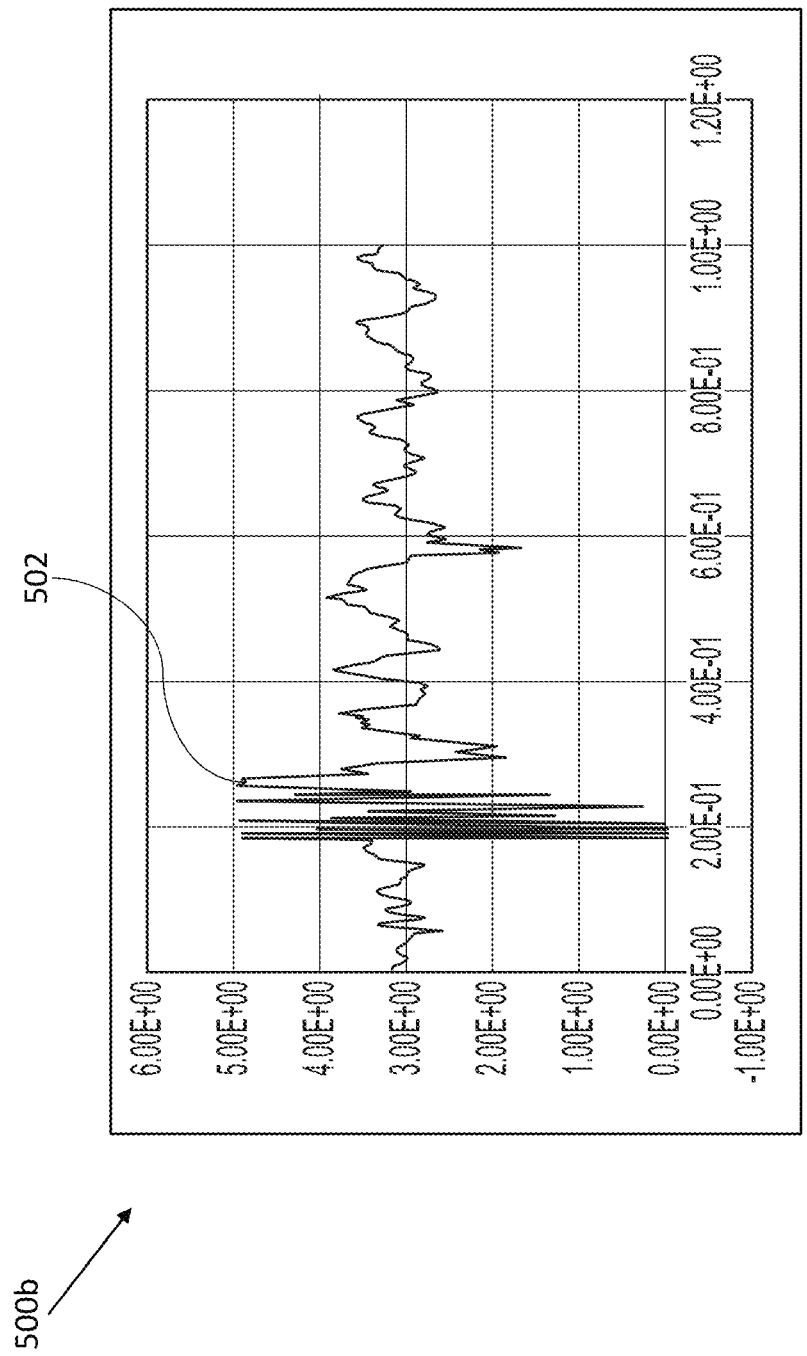
Figure 5C:
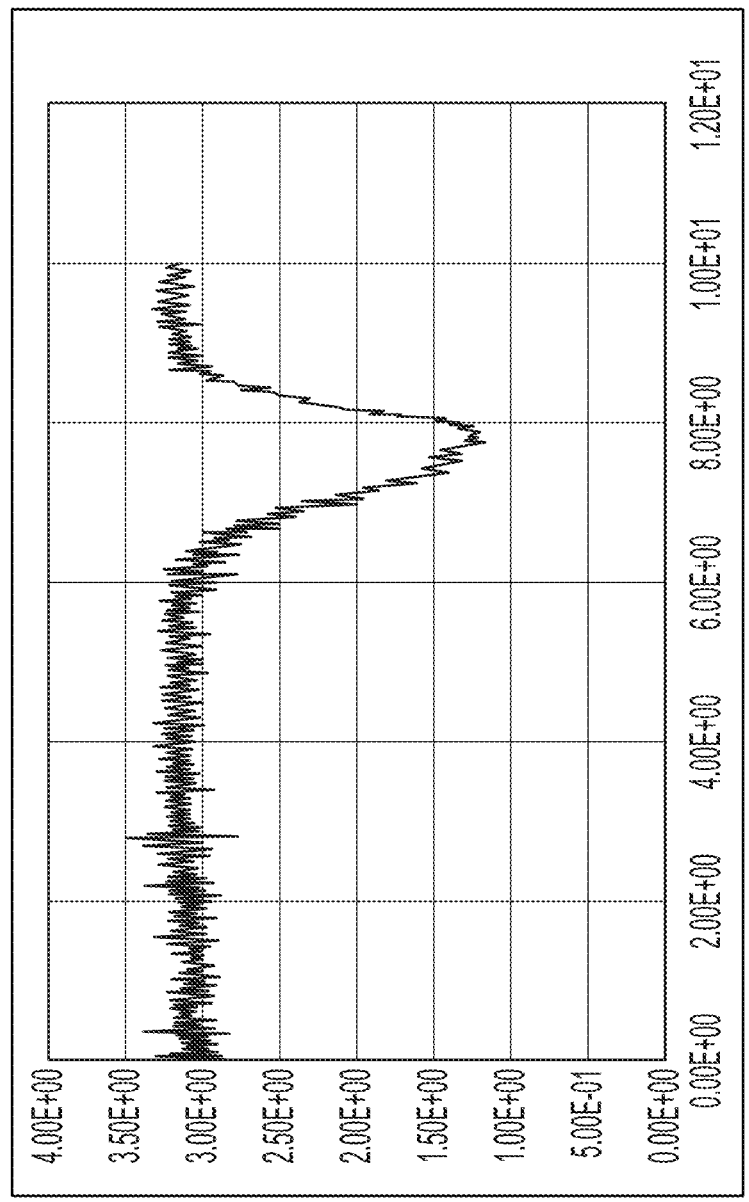

Referring now to FIGS. 5a-5c, graphs 500a-500c depicting device output from a 250 μm magnet within a platform in accordance with the subject technology are shown (configured similarly to the device 400a). In testing, the platform 100 was connected to a socket and roughly 5 mVpp of noise was produced, which corresponds to 2.5 mG acceleration. With a 7 uG at 1 Hz bandwidth resolution, this suggests a quiet environment and filtering might have a head room of 350×. A finger-tap step response suggests a resonant frequency of about 150 Hz (with data sheet figures looking to be around 400-500 Hz). This initial response is low, and likely the result of passive filtering electronics.

Graph 500b shows the frequency output of the platform 100, denoted by graph line 502. A finger-tap step response appeared to demonstrate a dominant resonant frequency around 10 Hz. A roughly 500 Hz change from the addition of a magnet of 150 ug was expected, and is consistent with the graph 500b.

As illustrated by graph 500c, sensor signal over time is shown. A 2V deflection was seen when the large N42 magnet's negative pole was brought within one foot away of the sensor and then pulled away again. Light characterization of the N42 magnet suggests that it produces a field of 100 uT and a gradient of 10 uT/cm at 1 ft away. This suggests a sensitivity of 2V/10 uT/cm. The noise on magnetic sensor was about 200 mVpp, which would correspond to 1 uT/cm. Considering the 250× headroom that might be gained in a quieter environment, this suggests a limit around 3 nT/cm. If it can handle a 500 μm magnet, this would be 300 pT/cm and a 1 mm magnet would be around 30 pT/cm.

Finally, normally two MEMS structures (or paddles) are positioned on the device and are nearly identical. This design can be useful for common mode and drift cancellation. There is an output of the device that appears to only record signal from one of the structures, so we only functionalize one of them for now. To that end, one of the paddles was ripped away in the magnetic sensor device, and so the noise levels might be much higher. We also know the package seems to be ferromagnetic, which is certainly producing some unwanted shielding of the device and decreasing its sensitivity. These will all be things to be addressed.

Figure 6:
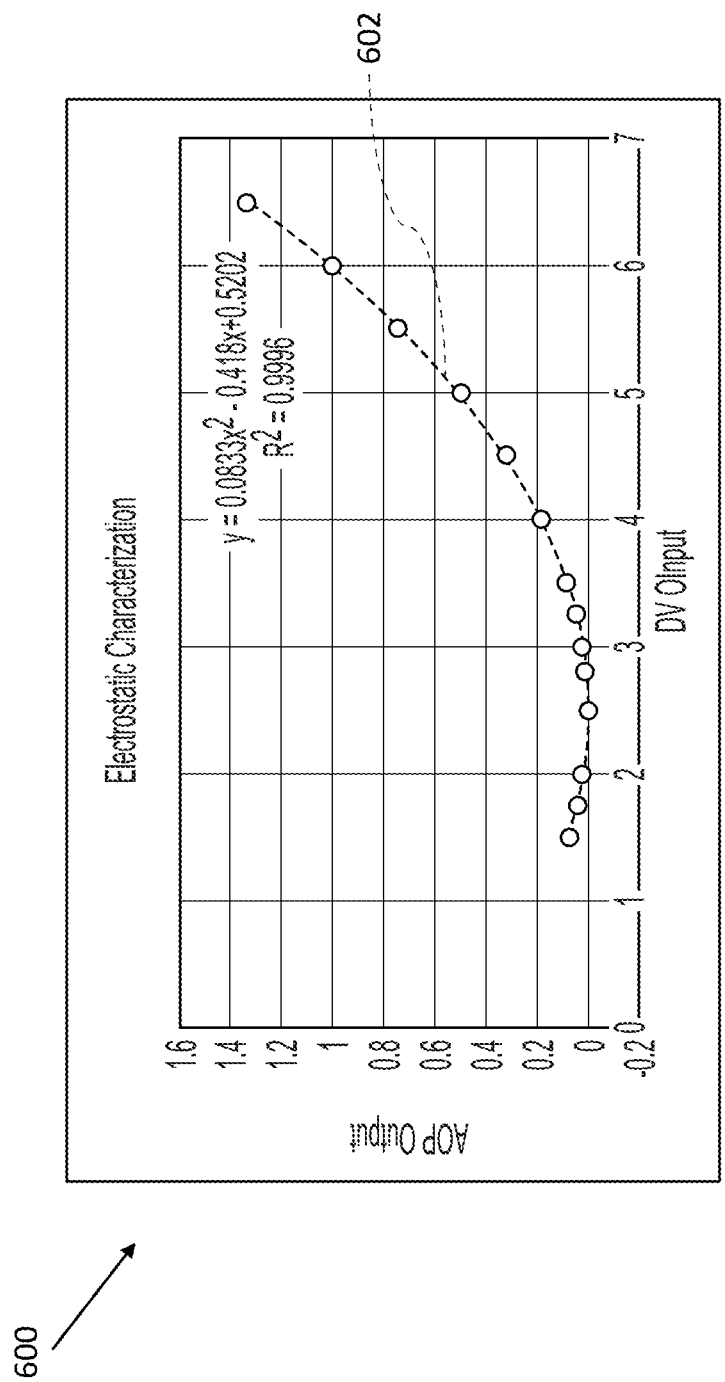
FIG. 6 is a graph of DV input to a sensing platform in accordance with the subject technology.

Referring now to FIG. 6, a graph 600 depicts DV input of a platform 100 in accordance with the subject technology when connected to DC voltage, as given by graph line 602. The platform 100 appeared to be sensitive to voltages below 2.5 volts down to 1.5V. It bottomed out 6.5V in its upright position. It could be flipped over to create greater headroom for larger DV actuation.

For further testing, a 500 μm magnet is placed on the platform 100 using a pick and place device. The platform 100 is not powered during placement because structures are far less sensitive to these assembly methods.

Figure 7:
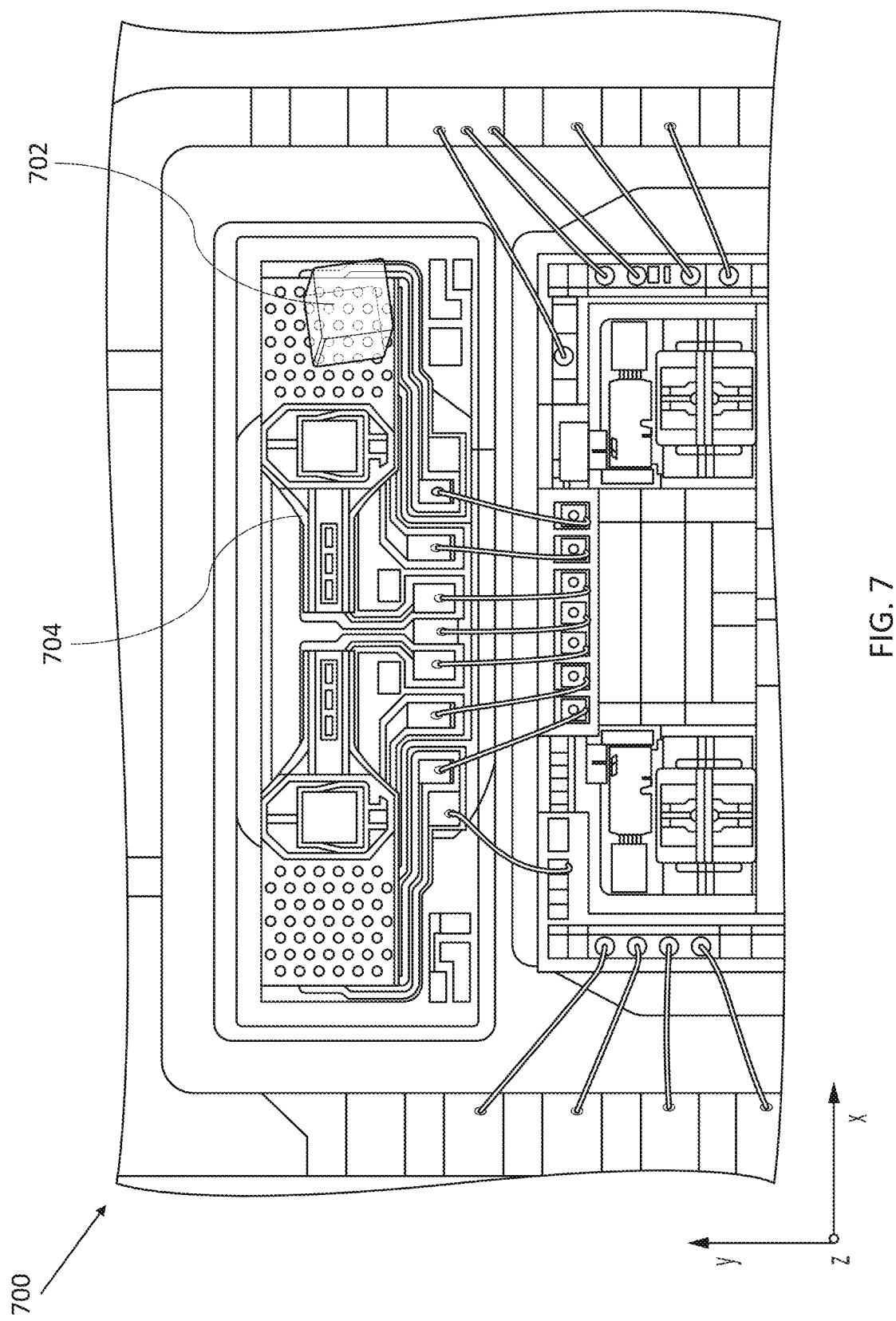
FIG. 7 is an overhead view of a sensor in accordance with the subject technology.

Referring now to FIG. 7, a perspective view of an exemplary device 700 in accordance with the subject technology is shown. The device 700 includes a magnet 702, integrated on a flexible beam 704, which can be arranged similarly to the other arrangements of magnets fixed to capacitor plates shown herein. In the device 700 of FIG. 7, the magnet 702 was connected to the beam 704 using UV glue. However, more UV glue was used than is optimal in the device 700 pictured FIG. 7, and the magnet 702 was stuck down. This process was repeated a second time, using less UV glue and an optimal device was created. The magnet is on a rather extreme angle, rotated in the XZ plane. This is because larger, 200 µm diameter pipettes were used to manipulate these magnets, and the mouth of the pipette is on an extreme angle for the 200 µm pipettes used. This resulted in the magnet not lying flat underneath the microscope during assembly in the setup shown and described.

Figure 8A:
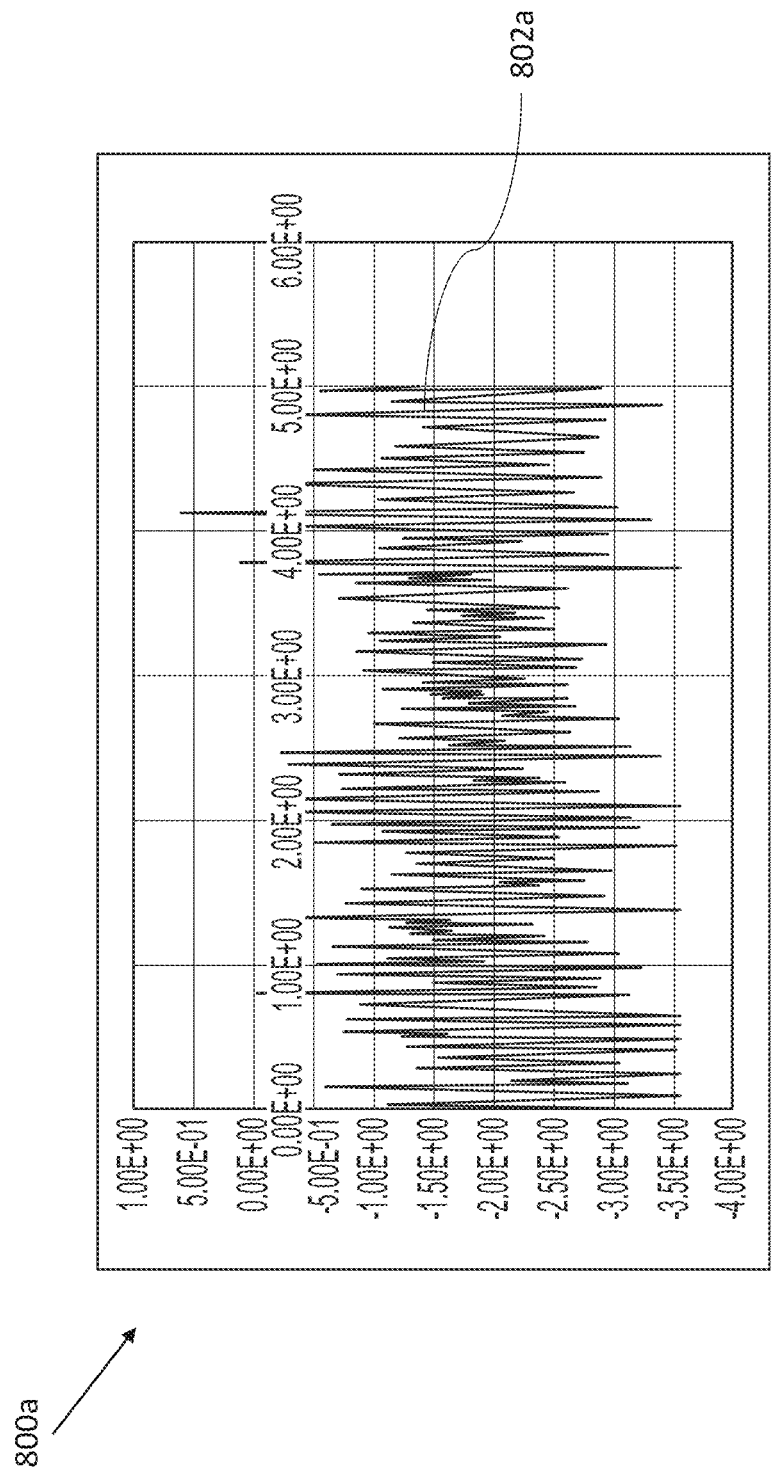
FIGS. 8a, 8b, 8c are graphs of output of the sensor of FIG. 7.
Figure 8B:
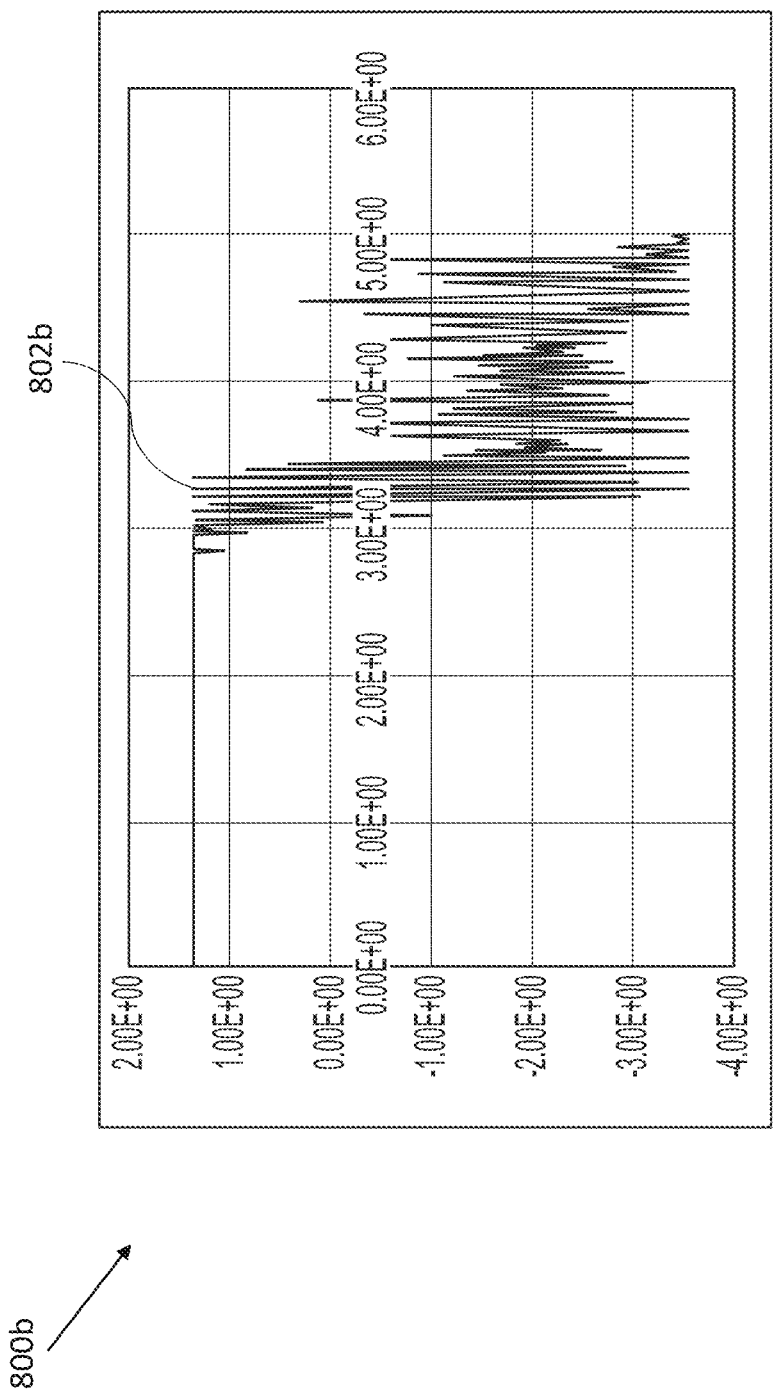
Figure 8C:
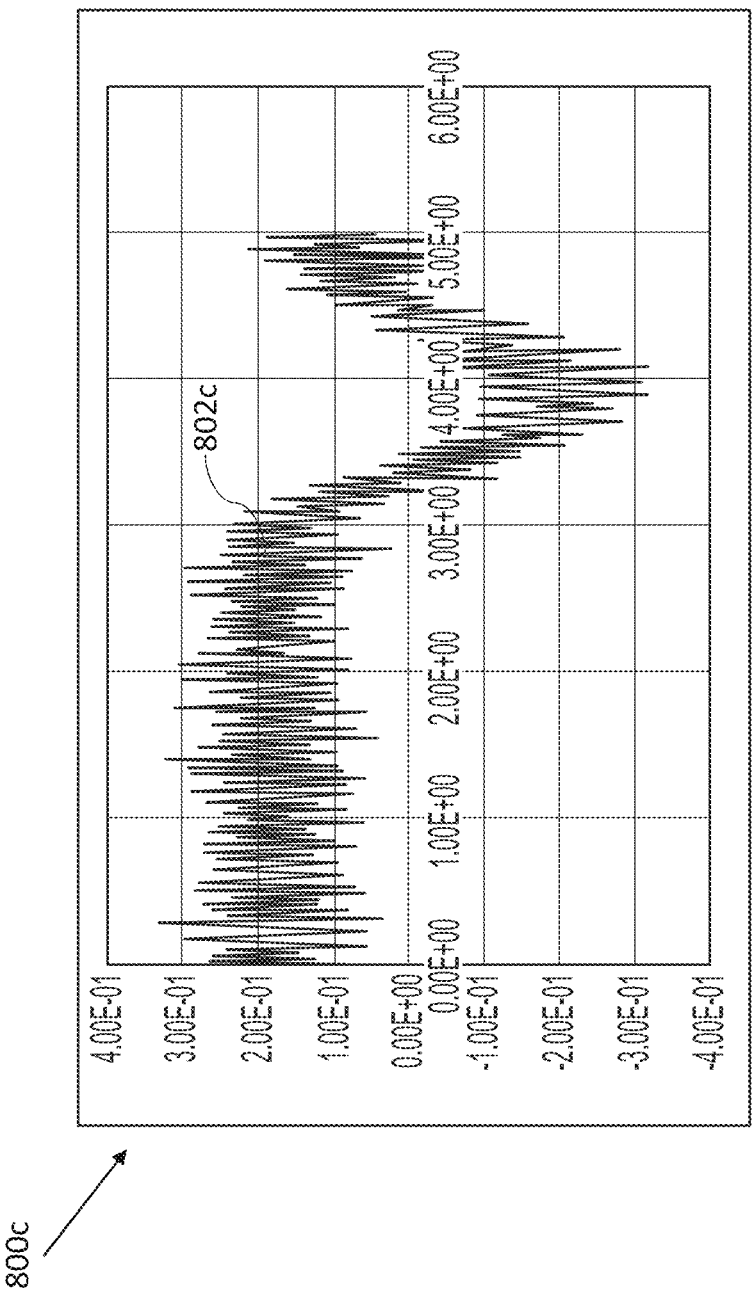

Referring now to FIGS. 8a-8c, graphs 800a, 800b, 800c show the output 802a, 802b, 802c of an experimental device as described above. The graph 800a is "hand noise", as the device is held at an angle. The device must be held at a proper angle to get a signal output and so the noise is greater due the natural shaking of the hand, as illustrated by graph line 802a. This is 2-2.5 Vpp. Graph 800b depicts output as the device is titled in and out of its sensitive range. This is about a 5 degree sweet spot (smaller angular range than the 250 µm mag). It appears to be sensitive from −3.5V to 1.2V (an offset of 3.5V is being applied). This gives a total range of 4.7V, which is expected. Noteworthy is that the lower range doesn't bottom out like the top range does. This indicates that the magnet may be hitting something or is experiencing another issue.

Next, the device was stood up on a table such that it was in sensitive range without hand contact. The desk noise is shown to be about 200 mVpp, as shown in graph 800c by graph line 802c. Then, a large N42 magnet is brought from 3 ft to 2 ft from the device. This is estimated to be a 1.15 uT field, from extrapolation of Hall sensor data (the Hall sensor can't easily sense below 100 uT). It is estimated to be 160 nT/cm gradient field. We see that this field causes a 400 mV deflection. Thus, the sensitivity is comparable to 2.875 uT/V and/or 400 nT/cm/V. The inverse descriptions are 0.347 V/uT and/or 2.5 mV/nT/cm (2.5V/uT/cm). We don't know yet what combination of field intensity and field gradient we are sensing.

While the numbers in this report demonstrate sensitivity to very weak magnetic fields, further optimization is still possible, including by better aligning the magnets. These results suggest the ability for the device to handle larger magnetic masses and great utility for higher order gradiometers, where multi-magnet arrays are assembled on MEMS structures to sense unique magnetic fields.

Figure 9A:
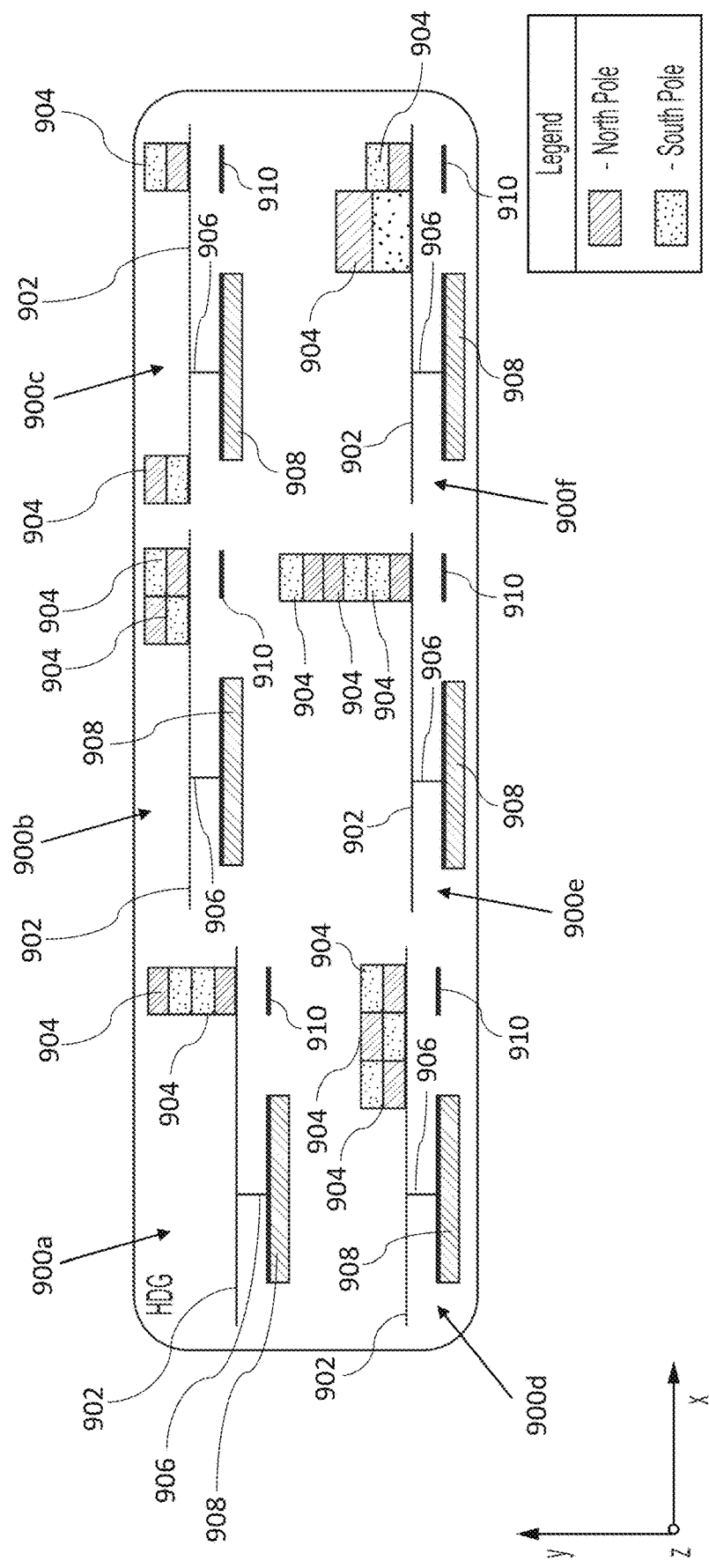
FIGS. 9a, 9b are schematic diagrams of exemplary arrangements of sensors in accordance with the subject technology.
Figure 9B:
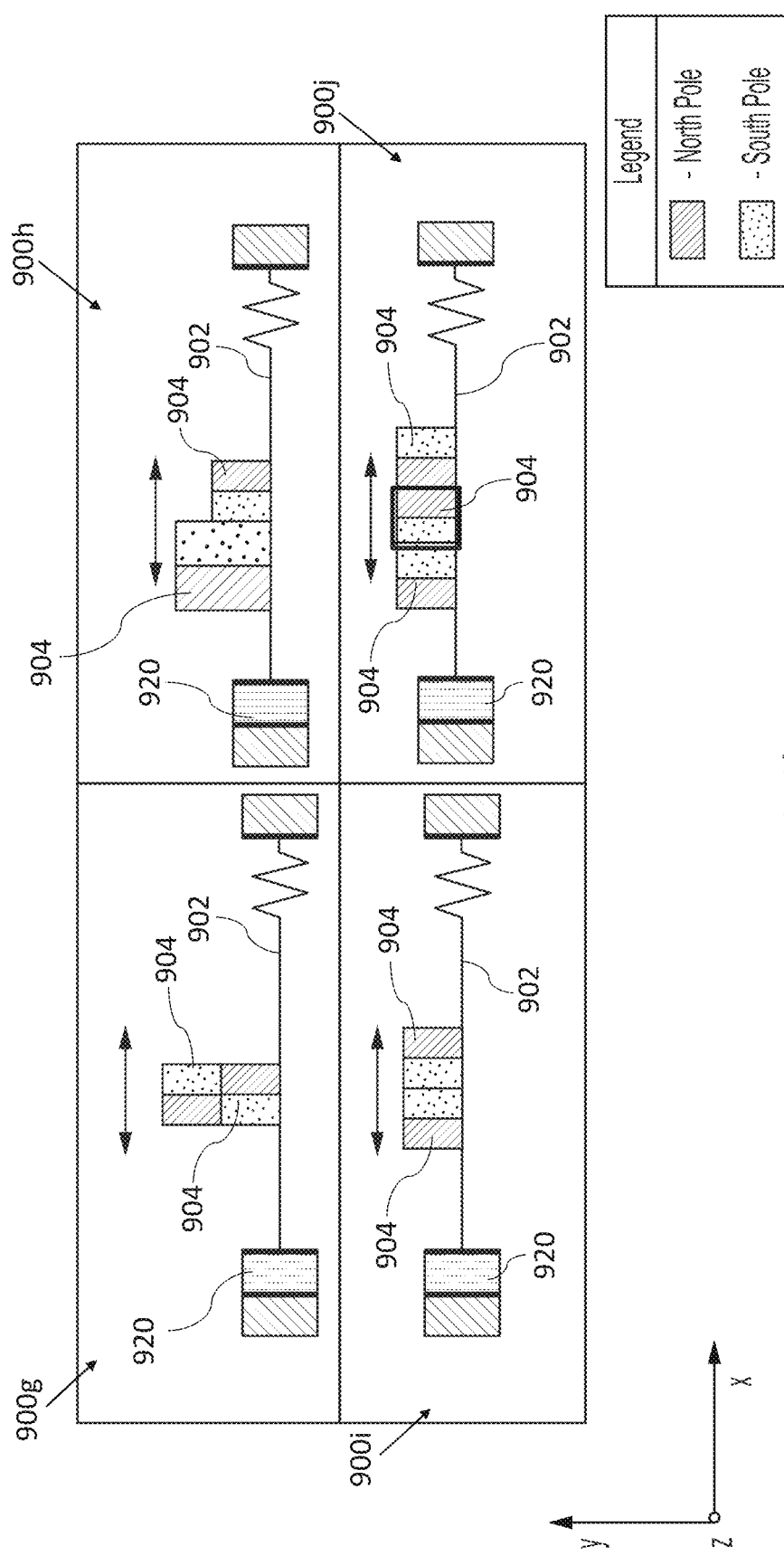

Referring now to FIGS. 9a-b, various other arrangement of gradiometer devices 900a-900j (generally 900) in accordance with the subject technology are shown. These designs can be incorporated as part of, and/or include similar components to, the other sensors and devices described herein (e.g. platform 100), except as otherwise shown and described. The devices 900a-900f pictured in FIG. 9a include a number of magnets 904 arranged on a beam 902 (e.g. upper capacitor plate), or coupled to other magnets 904. The poles of each magnet 904 are illustrated separately, as the polar orientation of the magnet 904 determines the reaction of the device 900 to a magnetic field. The beam 902 is supported offset from a fixed substrate and lower capacitor plate 908 by a supportive pedestal 906. The beam 902 is designed to pivot around the supportive pedestal 906, around a "z" axis as force is applied to the magnets 904. The sensing element 910 measures the magnetic field from deflection of the beam 902, and the device 900 can therefore measure a gradient magnetic field based on that deflection. Note that these devices 900 are configured to stiff and resistant to torsional forces, which correspond to magnetic field intensities. Thus the devices 900 have selectivity of gradient magnetic fields as a direct measurement. This also applies to the other devices (e.g. gradiometers) discussed herein.

The devices 900g-900j picture in FIG. 9b include a number of magnets 904 positioned to oscillate on a beam 902 between fixed ends. The devices 900g-900j also include a capacitive sensing (and/or actuation) device 920.

Figure 10:
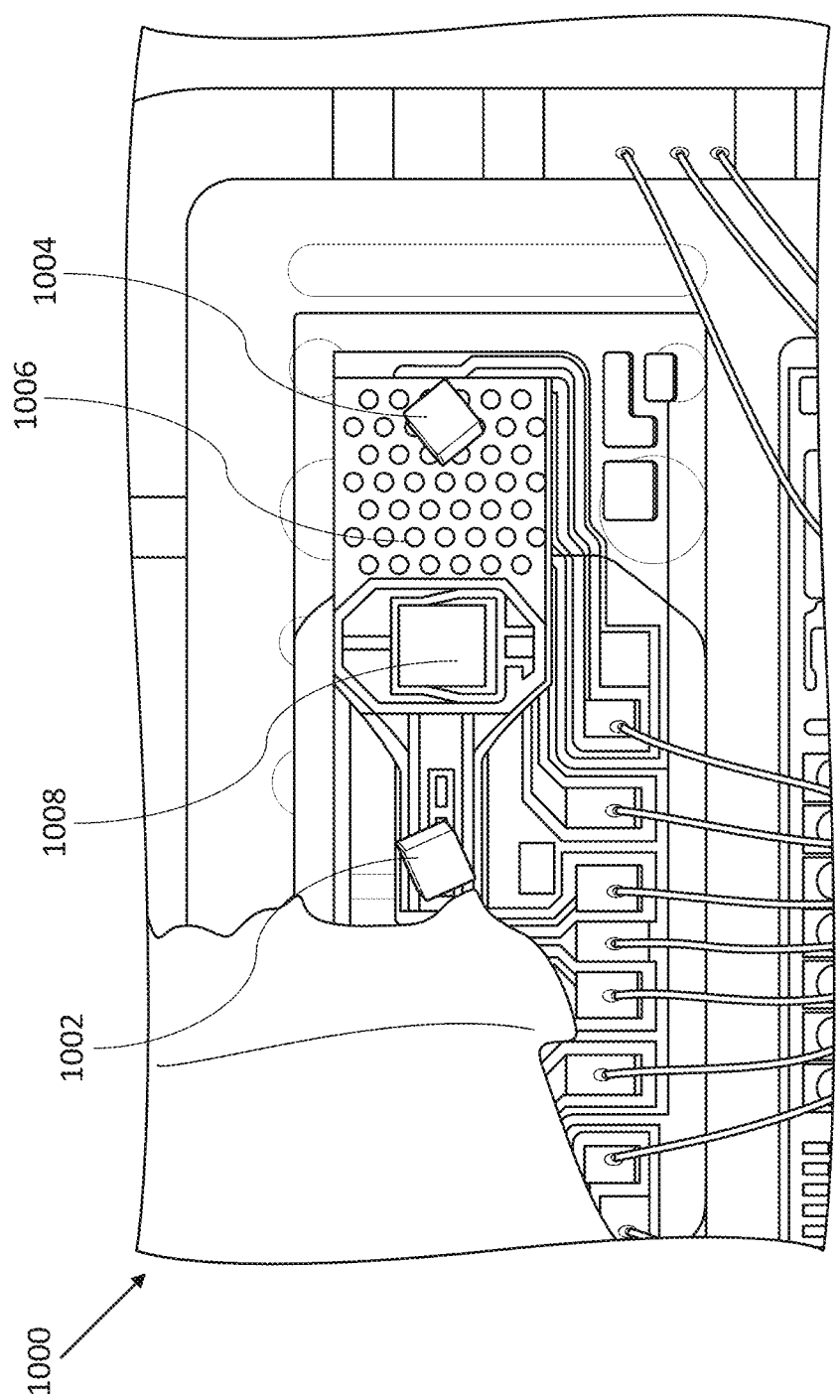
FIG. 10 is an overhead view of a sensor in accordance with the subject technology.
Figure 11:
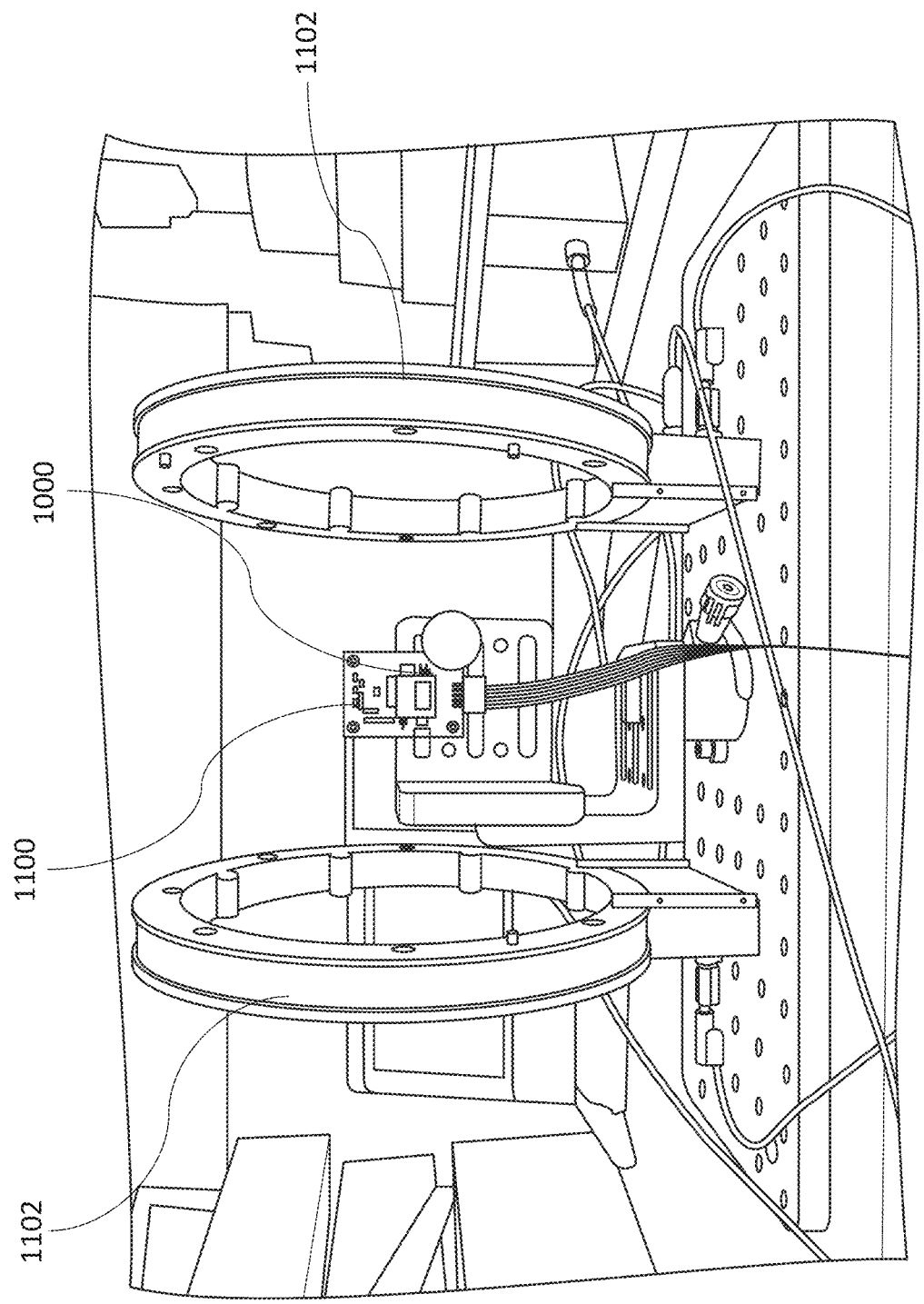
FIG. 11 is a perspective view of the sensor of FIG. 10 integrated into an experimental platform.

Referring now to FIGS. 10-11, further experimental setups are shown. As shown therein, magnets 1002, 1004 are attached on opposing sides of a paddle 1006 (or plate), configured to flex around the fixed central pedestal 1008 to form part of a sensing device 1000. The magnets 1002, 1004 are angled at about 14 degrees, and 17 degrees respectively. On the same device 1000, there was no bowing of the paddle 1006 due to interaction of the magnets 1002, 1004, and the magnets 1002, 1004 do not interfere with each other during fabrication.

The device 1000 was connected within a sensing platform 1100 fixed between two 500 turn coils 1102. This experimental setup is able to rotate the platform 1100 within the center space of the coils 1102. The setup also has the ability to tilt SDI devices so they are within measurable range. In this setup, the device 1000 is also sensitive while upside down.

Figure 12:
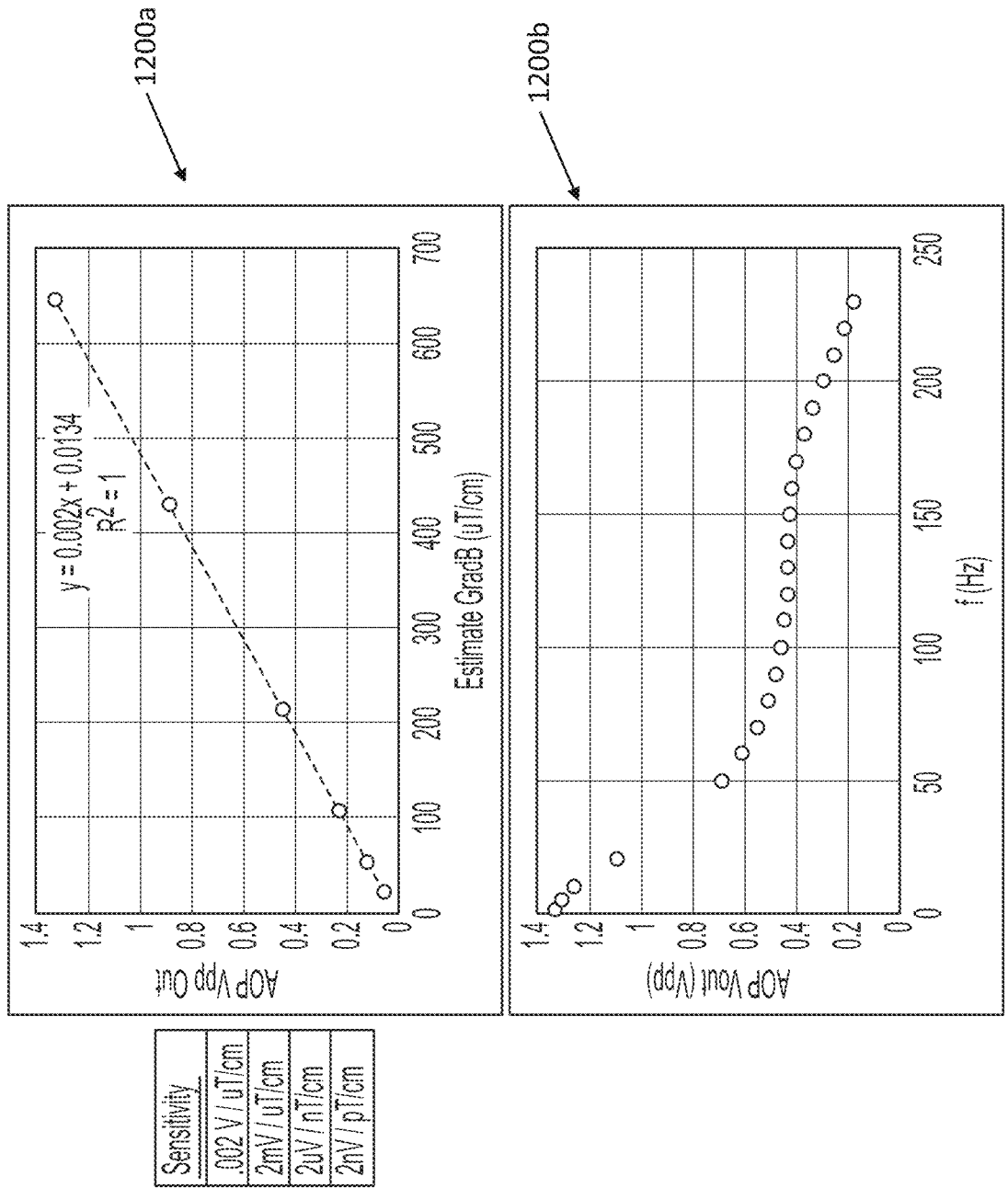
FIG. 12 shows graphs of the output of the experimental platform of FIG. 11.

Referring now to FIG. 12, electromagnetic characteristics of the device 1000 are shown in graphs 1200a, 1200b. The device 1000 provides a linear output and would require 200 nV to see 100 pT/cm. Previous 250 µm device was estimated around 6 mV/uT/cm, or 16 uV/nT/cm, making this 10× worse. Resonant frequency is about 160 Hz, where the previous 250 250 µm magnet was estimate around 130 Hz.

Figure 13:
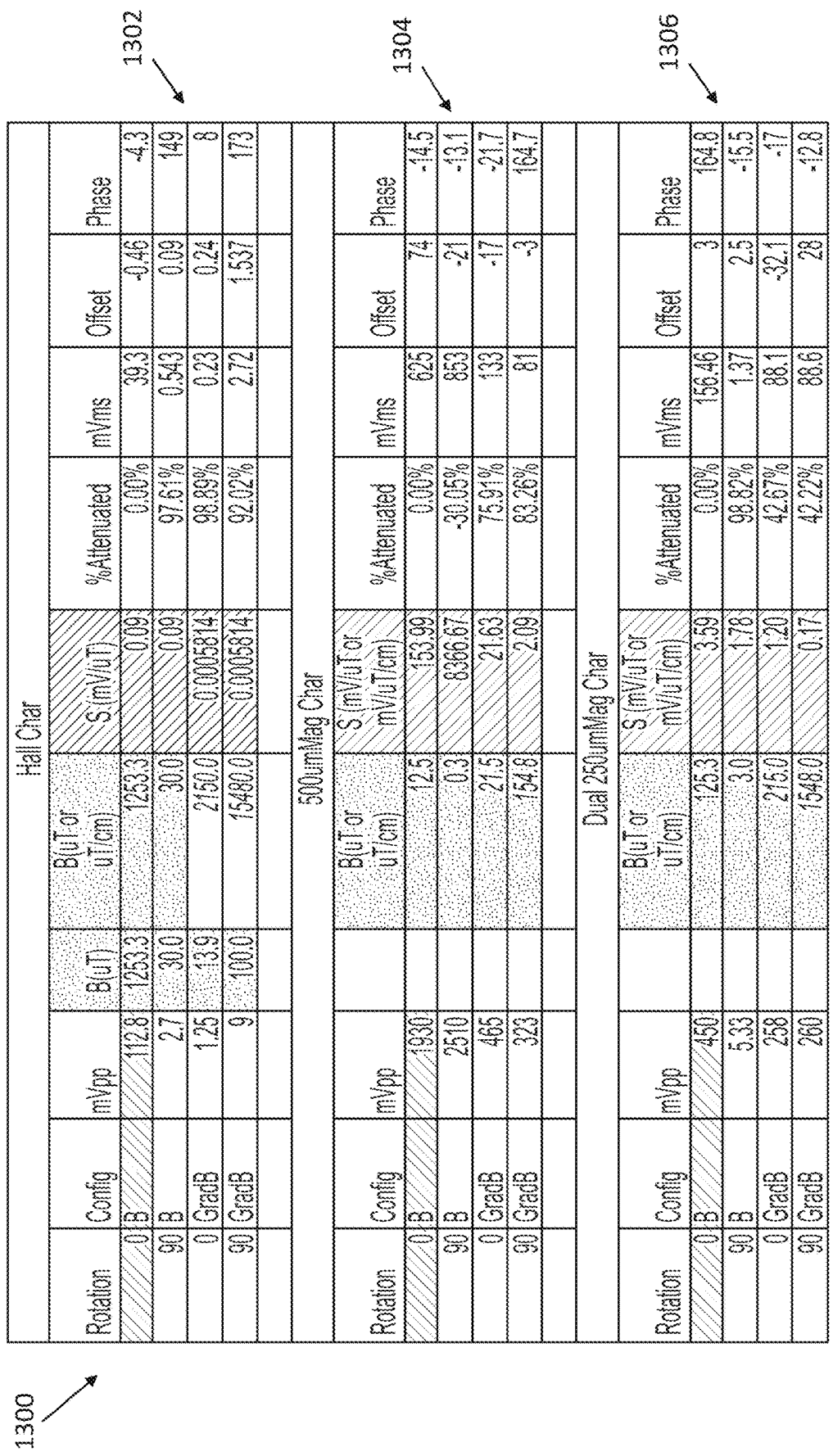
FIG. 13 is a table of sensor characteristics, including data for sensors in accordance with the subject technology.

Referring now to FIG. 13, a table of characteristics shown, comparing Hall sensor characteristics 1302, a 500 µm magnet 1304, and dual 250 µm magnet 1306. Here we are selectively sensing a gradient magnetic field. The design is not so sensitive, but is clean, having 10 mV of noise while the previous 250 µm magnet had about 200 mV of noise.

With respect to the Hall sensor, the dual 250 m magnet exhibited the following: 40 times more sensitive than the A1359 Hall sensor to magnetic intensities; 2064 times more sensitive than the A1359 Hall sensor to first order gradients; 2.99 times more sensitive to intensities than to gradients; 0.49 times more sensitive to perpendicular intensities than to parallel intensities; and 1.48 times more sensitive to perpendicular intensities than to gradients.

With respect to the Hall sensor, the 500 µm magnet exhibited the following: 1711 times more sensitive than the A1359 Hall sensor to magnetic intensities; 37200 times more sensitive than the A1359 Hall sensor to first order gradients; 7.12 times more sensitive to intensities than to gradients; 54.33 times more sensitive to perpendicular intensities than to parallel intensities; and 386.85 times more sensitive to perpendicular intensities than to gradients.

Results from the simulation and experimentation were compared. In the simulation, there was an estimated 56.5 nm deflection from a 20 uT/cm gradient, (150 mV eq), yielding 7.5 mV/uT/cm. The estimate was zero deflection if perfectly aligned. And an estimate of 83 nm deflection (220 mV eq) if torquing only one magnet. This is in a 12.5 uT field, so 17.6 mV/uT.

In the experiment, 260 mV deflection was measured from 215 uT/cm gradient (97.5 nm eq), yielding 1.2 mV/uT/cm. The magnets were not perfectly aligned. We measured 450 mV deflection (168 nm eq) from 125 uT field, so 3.6 mV/uT.

The simulation tracks decently well with fabrication. The results suggest the device is mostly working as expected but includes some misalignment during fabrication. The device is not incredibly sensitive, for example it requires 200 nV to see a heartbeat. The simulation suggests a factor of 6.25× if alignment is improved. If the same configuration were fabricated using 500 μm magnets another 8× would be expected, for a total of 50×. That would require us to sense 10 uV. This could be achieved using several other sensors in parallel post-process.

Figure 14:
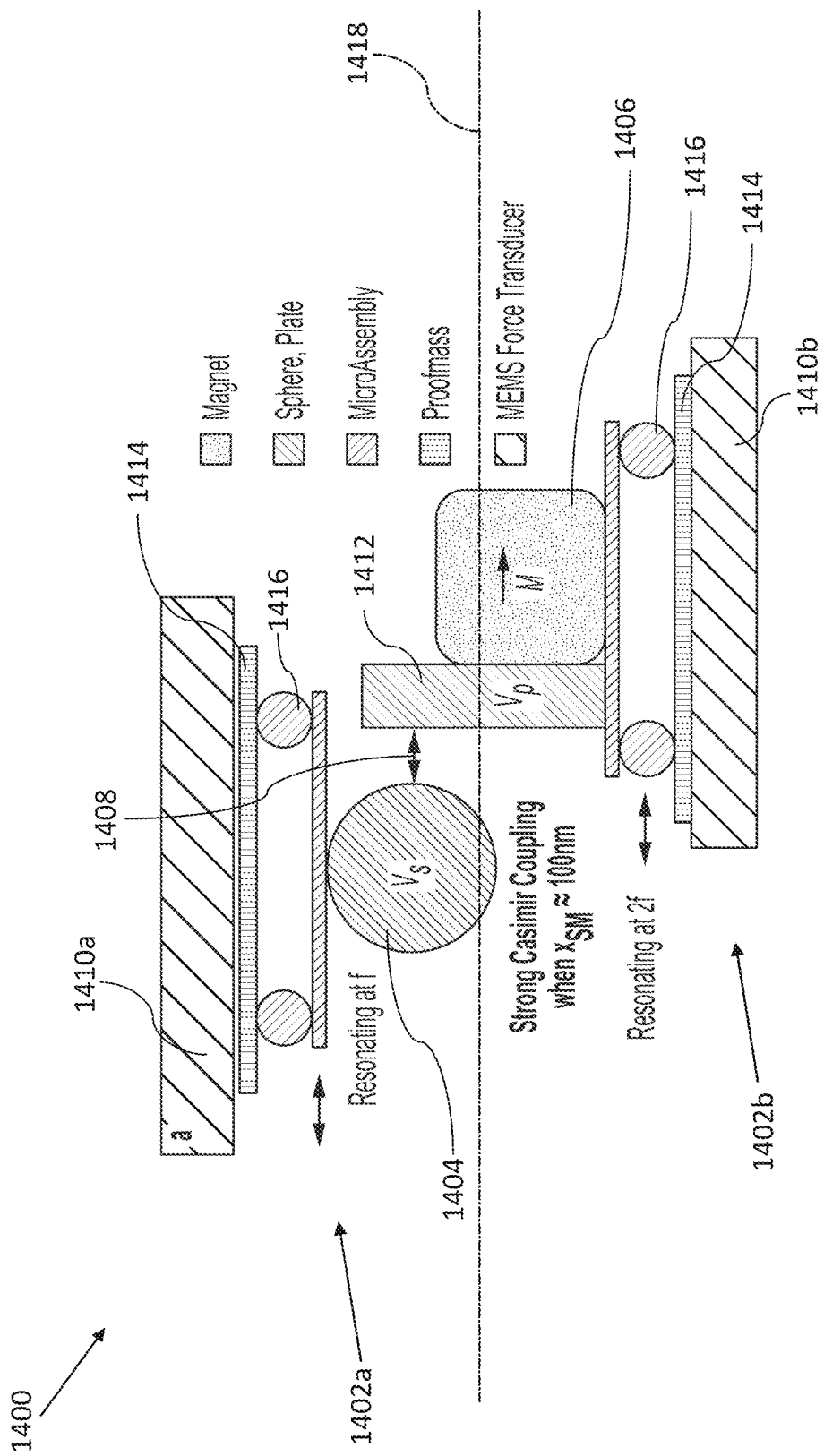
FIG. 14 is a schematic diagram of a Casimir force metrology platform in accordance with the subject technology.

In some cases, the sensing devices described herein can be incorporated as part of a Casimir coupled gradiometer, or a higher order (i.e. second order or greater) gradiometer. Referring now to FIG. 14, an exemplary Casimir coupled gradiometer is shown, which can further be incorporated as part of the devices described herein.

The sensing system 1400 acts as a gradiometer and includes a Casimir Force metrology platform 1402a coupled to a MEMS gradiometer platform 1402b. The sensing system 1400 includes a sphere 1404 (or microsphere) positioned in close proximity to a magnet 1406 (or micromagnet), where the resonant modes are coupled by the quantum-derived Casimir Force. The magnet 1406 is attached to a gold plate 1412, the magnet 1406 and plate 1412 moving together. Both sphere 1404 and magnet 1406 are driven at resonance, where the magnet 1406 is driven at two times the frequency of the sphere 1404, to accomplish parametric modulation. Force from a weak gradient magnetic field will induce a small deflection of the magnet 1404, decreasing the separation 1408 ($x_{SM}$), and inducing a frequency and amplitude shift in the sphere oscillation, via the Casimir coupling. In order to successfully couple these two systems 1402a, 1402b, a highly tunable design is necessary. By assembling the sphere 1404 and magnet 1406 on independent MEMS force transducer platforms 1410a, 1410b, as shown in platform 1400, their independent actuation is completely controlled. By inverting the sphere platform 1402a, a separation distance 1408 between the sphere 1404 and plate 1412 of near 100 nm can be achieved. As shown in FIG. 14, each platform includes a proof mass 1414 for testing, and an independent micro assembly 1416 to allow for independent movement of the respective systems 1402a, 1402b along a central axis 1418. In other words, the sphere 1404 can move independently of the magnet 1406 and plate 1412 combination along the central axis 1418.

Components of the system 1400 can be fabricated individually using commercially available MEMS accelerometers. This is accomplished using precise control of a vacuum pick-and-place system, and feedback from a live sensor (post-release MEMS). The micromagnet used in the gradiometer design is functionalized by the gold plate 1412, positioned elongated vertically such that it's planar face is directed towards the sphere 1404. The platform 1402a with the sphere 1404 is inverted such that the sphere 1404 has a clear pathway to come into close proximity to the plate 1412. Both platforms 1402a, 1402b enable control of static position, oscillation amplitude, frequency, phase, and detection. The drive parameters are controlled via a built-in electrostatic self-test feature on the ADXL 203 platform, which can be used for analog control of the microobjects via pulsed width modulation (PWM). This feature is also used to calibrate for and negate the effect of an anticipated electrostatic coupling between the plate 1412 and sphere 1404. Notably, while a sphere and plate are used herein by way over example, it should be understood that other non-magnetic elements may also be used, including other non-magnetic elements in different orientations. However, a non-magnetic plate 1412 with its elongated planar surface facing a non-magnetic sphere 1404 have been found to be an advantageous arrangement.

Figure 15:
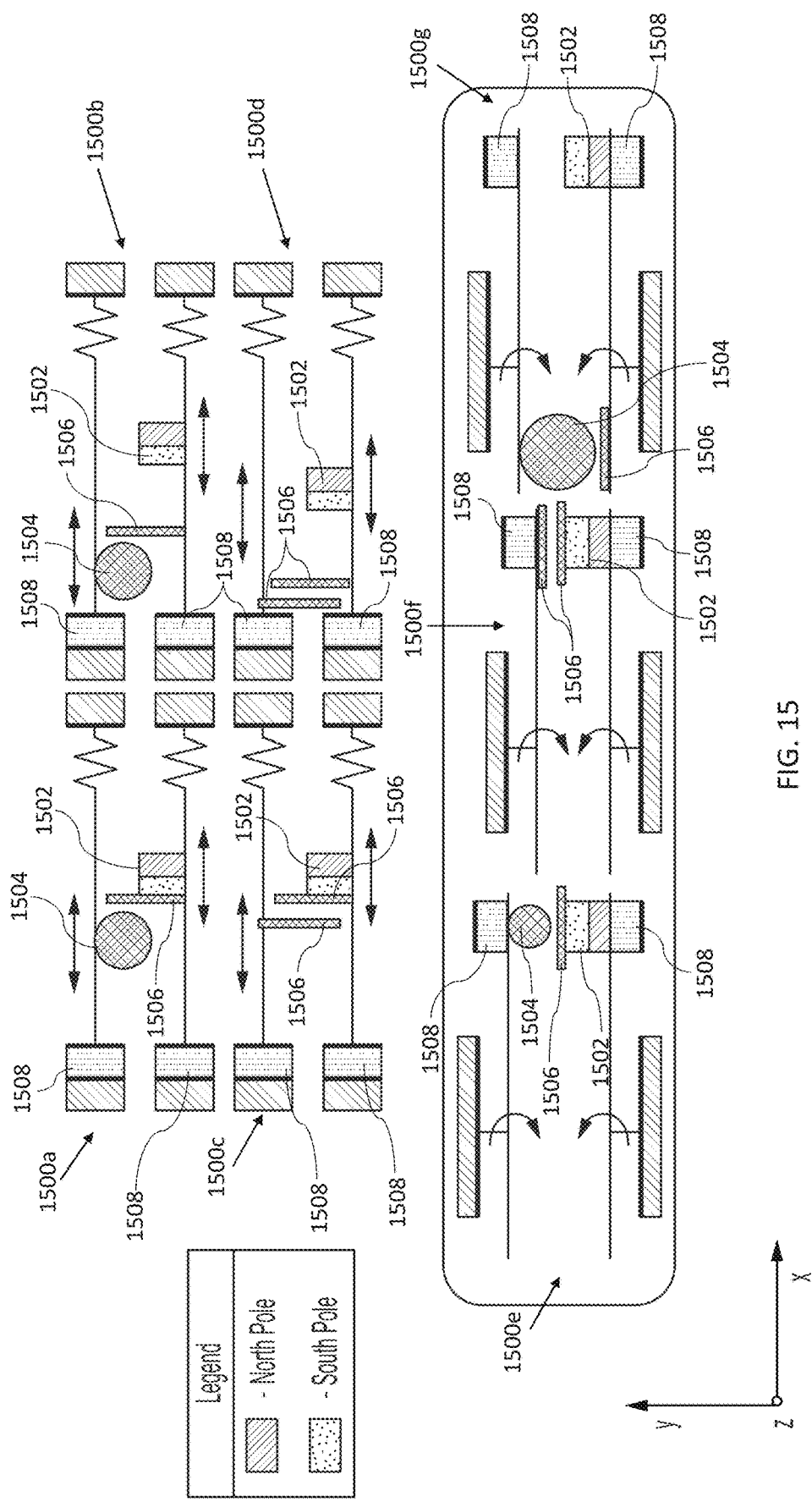
FIG. 15 shows schematic diagrams of exemplary arrangements of sensors in accordance with the subject technology.
Figure 16:
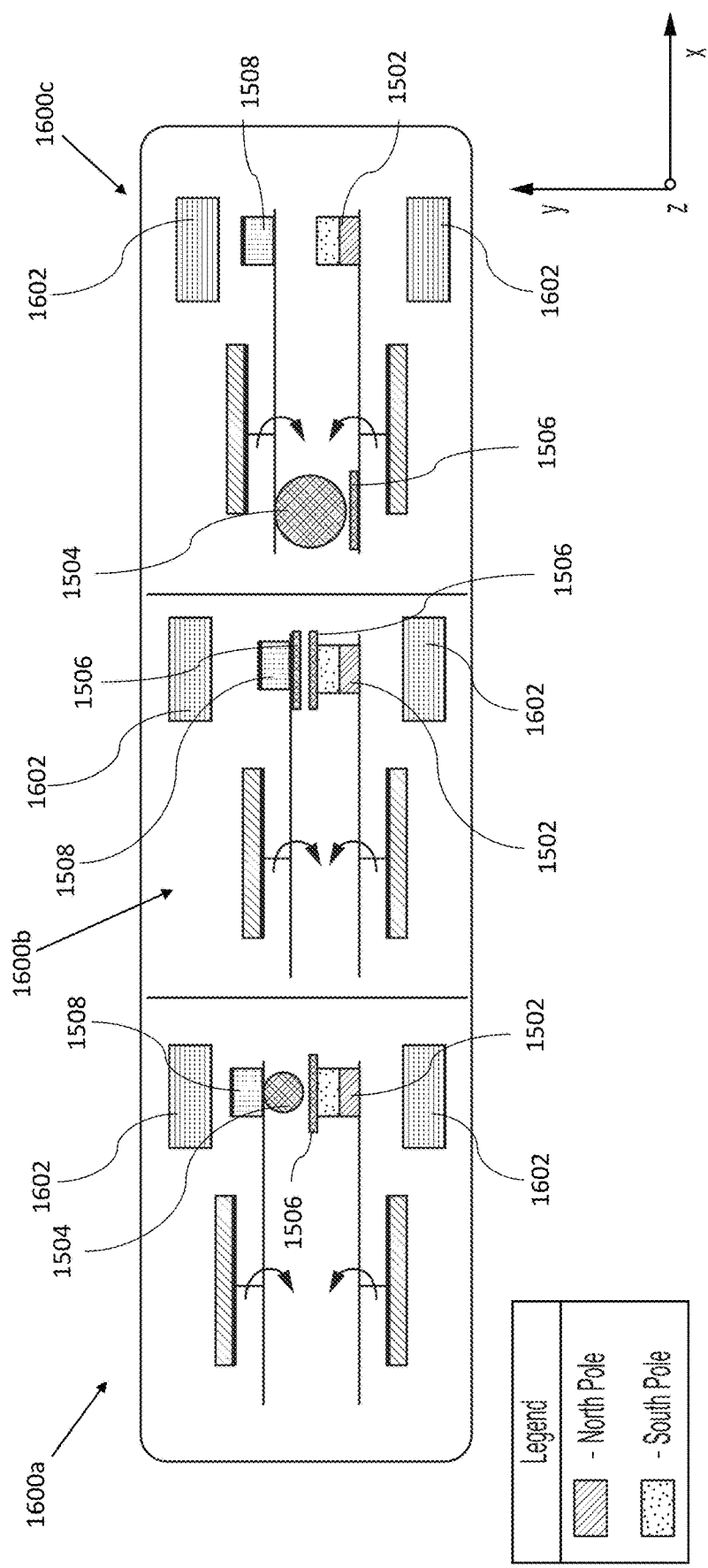
FIG. 16 shows schematic diagrams of exemplary arrangements of sensors in accordance with the subject technology.
Figure 17:
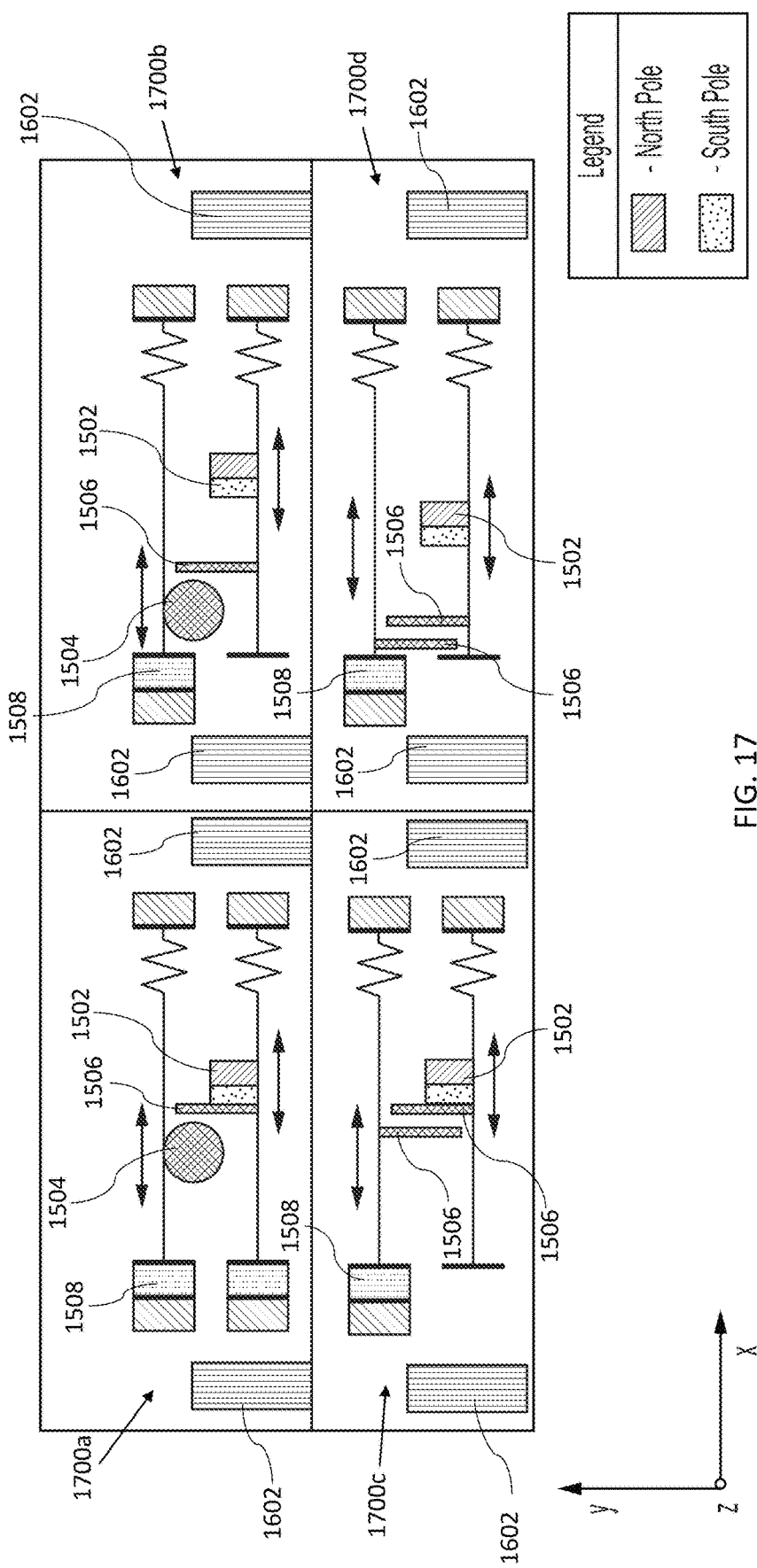
FIG. 17 shows schematic diagrams of exemplary arrangements of sensors in accordance with the subject technology.

Referring now to FIGS. 15-17, various other arrangement of gradiometer devices in accordance with the subject technology are shown, some of which incorporate a gold sphere and/or plates to form a Casimir enabled gradiometer. These designs can be incorporated as part of, and/or include similar components to, the other sensors and devices described herein, except as otherwise shown and described. Each device 1500a-1500g (generally 1500) includes an arrangement of magnets 1502, gold sphere 1504, gold plate(s) 1506, capacitive sensing (and/or actuation) devices 1508. The poles of each magnet 1502 are illustrated separately, as the polar orientation of the magnet 1502, and orientation of any sphere 1504 and/or plates 1506, determines the reaction of the device 1500 to a magnetic field. Arrows in the diagrams generally illustrate the movement of the device 1500 in response to force. The plates 1506 are either coupled to a separate plate 1506, or to a sphere 1504, and are coupled via either Casimir force or electrostatic force. For Casimir coupling, the plates 1506, or sphere 1504 and plate 1506, are spaced at less than 100 nm, while for electrostatic force they are spaced at less than 1 μm. A gradient magnetic field can be measured based on the device deflection. In an alternative arrangement, rather than the polar orientation shown, magnets 1502 could be instead replaced by any magnet, or magnet array, that produces a force in response to a gradient or higher order gradient field.

The devices 1600a-1600c additionally include an EM coil 1602 which produces an AC magnetic field to oscillate the magnet. The devices 1700a-1700d include opposing EM coils 1602 positioned outside opposing ends of the central beams on which the magnet, sphere, and plates are attached.

Figure 18:
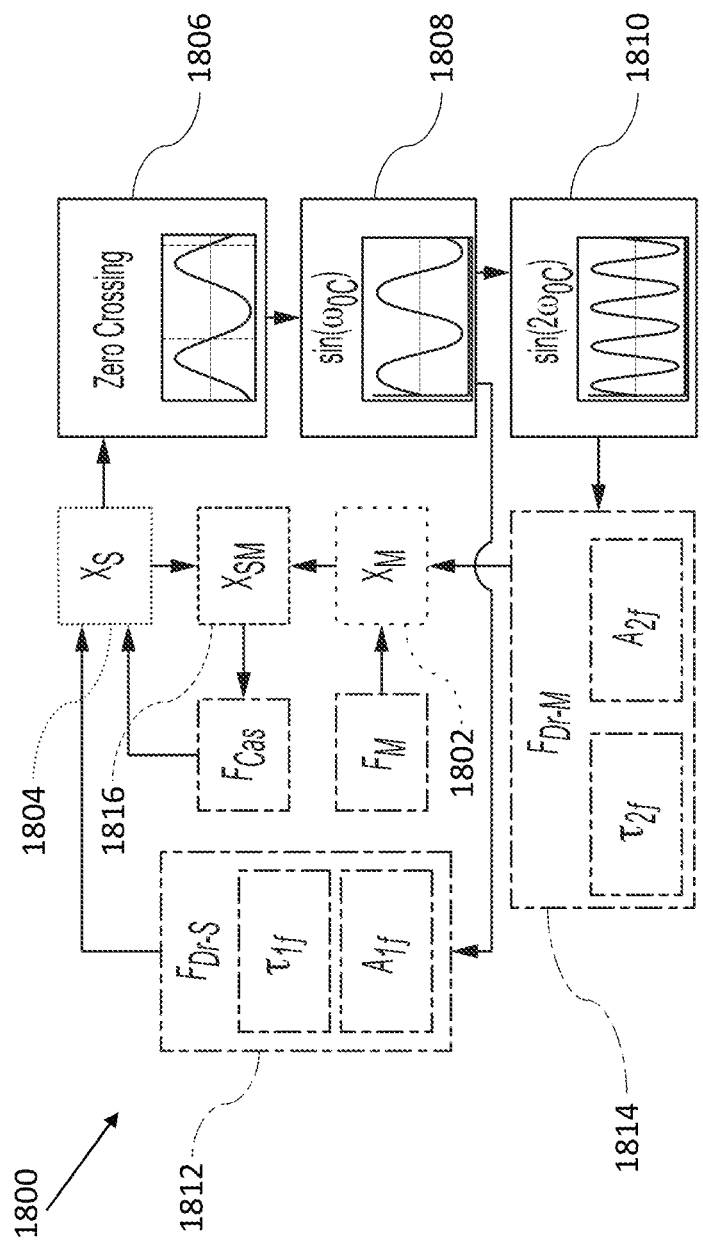
FIG. 18 is a functional block diagram 1800 shows an exemplary circuit design of components of a Casimir coupled gradiometer.

Referring now to FIG. 18, a functional block diagram 1800 shows an exemplary circuit design of components of a Casimir coupled gradiometer. Block 1802 represents the magnetic oscillator, while block 1804 represents the nonmagnetic oscillator. The nonmagnetic object does not need to physically oscillate necessarily. The magnet, however, is always physically oscillating in all designs. Analysis starts from block 1804, and oscillation here is recorded (nonlinear). The zero crossings 1806 are determined to produce a sine wave 1808 at the fundamental frequency. This is tuned (block 1812) and returned to the nonmagnetic oscillator 1804 to maintain its oscillation (without losing amplitude). The zero crossings 1806 are also used to produce a sine wave (block 1810) at 2× the fundamental frequency. This is tuned (block 1814) and used to drive the magnetic oscillator 1802. The coupling between the magnetic and nonmagnetic oscillators 1802, 1804 influences both objects (the coupling represented by block 1816). This is via either the electrostatic force, the Casimir force, or an electromagnetic force.

Importantly, force experienced by the magnet has nonlinear relationship with distance from the nonmagnetic object. The Casimir force is highly sensitive and is thus nonlinear. The electrostatic force and electromagnetic fields are also nonlinear and can produce an effect to enhance sensitivity.

Figure 19:
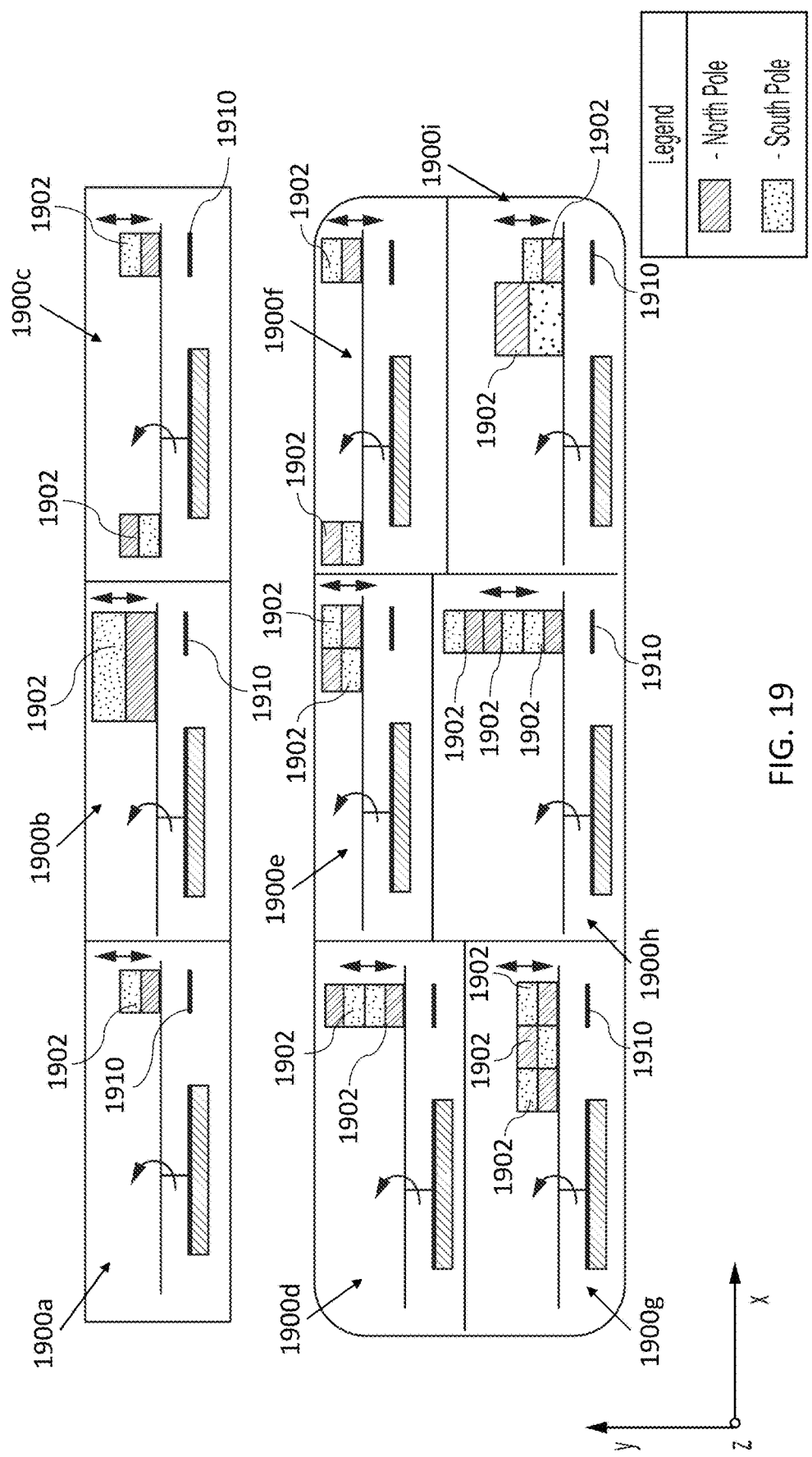
FIG. 19 shows schematic diagrams of exemplary arrangements of sensors in accordance with the subject technology.
Figure 20:
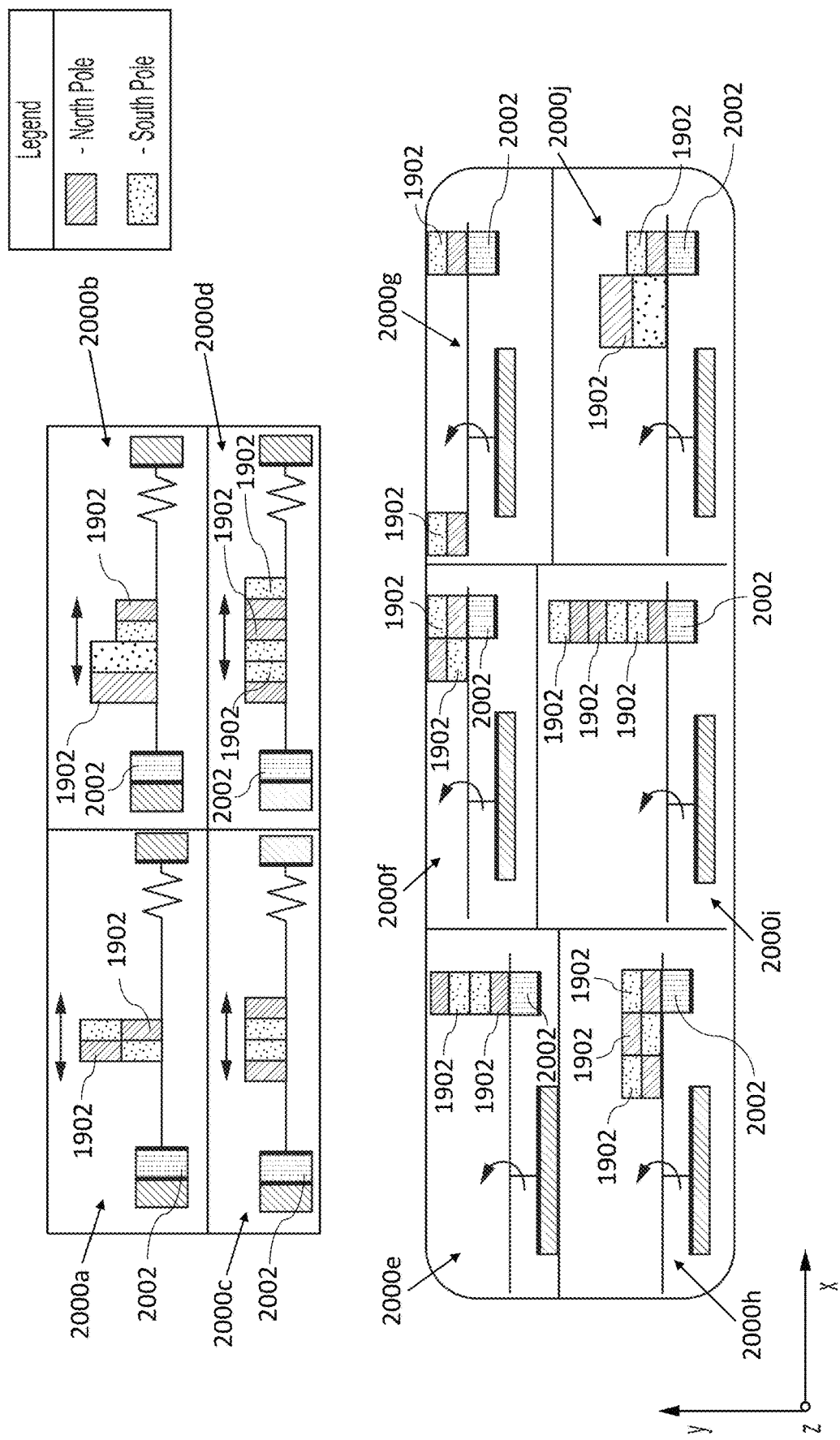
FIG. 20 shows schematic diagrams of exemplary arrangements of sensors in accordance with the subject technology.

Referring now to FIGS. 19-20, various other arrangement of gradiometer devices 1900a-1900i (generally 1900), 2000a-2000j (generally 20000) in accordance with the subject technology are shown. These designs can be incorporated as part of, and/or include similar components to, the other sensors and devices described herein (e.g. platform 100), except as otherwise shown and described. The devices 1900a-1900i pictured in FIG. 19 includes a number of magnets 1902 arranged on a beam (e.g. upper capacitor plate), or coupled to other magnets 1902. The poles of each magnet 1902 are illustrated separately, as the polar orientation of the magnet 1902 determines the reaction of the device 1900 to a magnetic field. The beam is supported offset from a fixed substrate and lower capacitor plate by a supportive pedestal, as show in platform 100. The beam is designed to pivot around the supportive pedestal, around a "z" axis as force is applied to the magnets 1902. The sensing element 1910 measures the magnetic field from deflection of the beam, and the device 1900 can therefore measure a gradient magnetic field based on that deflection.

The devices 2000a-2000j pictured in FIG. 20 are similar to the devices 1900, except that they include a device 2002, which can be a capacitive sensing device and/or an actuation device.

Thus, the device 2002 can move, or measure deflection of, the magnets 1902. Alternatively, the devices 2002 can measure resonance characteristics of the magnets 1902. Further, while the devices 2000e-2000j relate to magnet arrangements on a beam offset from a substrate, similar to platform 100, the devices 2000a-2000d are arrangements with magnets 1902 positioned on a beam to oscillate between fixed ends.

In general, magnetic sensing for the sensing systems disclosed herein has very broad applications, from geomagnetic surveying/monitoring, to biomagnetism, to navigation, to industrial process monitoring, and more. Described herein, in some embodiments, is a single-point magnetic gradiometer that uses torsional MEMS element to measure a translational force. The subject disclosure brings together a commercial MEMS platform, and permanent micromagnets, but the commercial form of this magnetic sensor has the potential to take many shapes. In some cases, a wafer-scale deposition of permanent magnetic material will be used as opposed to the assembly of preformed, sintered micromagnets. The MEMS design can be optimized in a custom design using the designs and features discussed above. These two processes can be fully integrated in a custom fab procedure.

Our unique expert knowledge in the field of magnetic sensing and high-resolution applications, such as biomagnetic imaging, made clear for us design features that would enhance the capability of our technology. We conducted an extensive search of MEMS devices using search terms for capacitive sensing and co-fired ceramic packages with the understanding that such devices would have a high chance of an available MEMS element that could be magnetically functionalized. We engaged in numerous discussions with scientists, engineers, and potential customers in a future B2B network, in search of MEMS technologies that might enhance our work. We integrated metal-on-glass MEMS technology used for sensitive vibration measurements. While the technology was designed and optimized in many ways for these measurements, there are several unique aspects that are ideal for magnetic functionalization and use as a MEMS single point gradiometer.

The MEMS structure disclosed herein is large (almost a millimeter long by a half a millimeter wide). Such a massive structure has a lower resonant frequency in the hundreds of Hz. When even more mass is added for magnetic functionalization, the resonance drops to near-DC frequencies. These low frequencies are where biomagnetic fields exist, posing an ideal design for such measurements.

All orientations and arrangements of the components shown herein are used by way of example only. Further, it will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements) shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology. For example, each claim may depend from any or all claims in a multiple dependent manner even though such has not been originally claimed.

What is claimed is:

1. A gradiometer comprising:
a platform having a first side, a second end opposite the first side, and a fixed support between the first side and second side;
a first magnet attached to a moveable segment of the platform offset from the fixed support and on the first side, the moveable segment of the platform configured to deflect with respect to a polarization axis of the first magnet in response to a magnetic force from an external magnetic field; and
a sensing element configured to measure deflection of the first magnet with respect to the sensing element, wherein the gradiometer directly measures a gradient of the external magnetic field based on the deflection of the first magnet.

2. The gradiometer of claim 1, wherein the gradiometer is configured to measure a change in the gradient of the magnetic field.

3. The gradiometer of claim 1, wherein the change in the gradient of the magnetic field is a higher-than-second order gradient.

4. The gradiometer of claim 1, further comprising a second magnet mechanically coupled to the first magnet and positioned to deflect along the polarization axis of the first magnet in response to the magnetic force from the external magnetic field, the first magnet and the second magnet being positioned such that a pair of like magnetic poles of the first magnet and the second magnet are adjacent.

5. The gradiometer of claim 1, further comprising a first non-magnetic element driven at a first resonance frequency along an axis of the movable segment of the platform; and
a second non-magnetic element attached to the first magnet and driven at a second resonance frequency along the axis, wherein the first non-magnetic element and the second non-magnetic element are coupled by a force along the axis, in resonance,
wherein the gradiometer is configured to determine a gradient magnetic field acting on one or more of the first non-magnetic element and magnet based on change in at least one resonance characteristic.

6. The gradiometer of claim 5, wherein:
the first non-magnetic element is a sphere;
the second non-magnetic element is a plate; and
the plate has an attractive force to the sphere.

7. The gradiometer of claim 6, wherein the attractive force is a Casimir force; and
the second resonance frequency is twice the first resonance frequency.

8. The gradiometer of claim 1, wherein the movable segment of the platform extends generally in a plane, and the sensing element is configured to measure deflection of the first magnet in a direction orthogonal to the plane.

9. The gradiometer of claim 1, further comprising a second magnet positioned on the moveable segment of the platform offset from the fixed support and on the second side.

10. The gradiometer of claim 9, wherein a polar orientation of the second magnet with respect to the moveable segment of the platform is opposite a polar orientation of the first magnet with respect to the moveable segment of the platform.

11. The gradiometer of claim 1, further comprising at least one additional magnet positioned on the first side of the moveable segment of the platform adjacent the first magnet.

12. The gradiometer of claim 1, wherein the moveable segment of the platform is at least one of: a plate; or a beam.

13. A gradiometer comprising:
a platform including a moveable segment;
a pedestal mechanically coupling the moveable segment to a substrate such that the moveable segment deflects around the pedestal, the substrate being fixed;
a first magnet attached to a first side of the moveable segment to deflect around the pedestal in response to a magnetic force from an external magnetic field;
a second magnet attached to a second side of the moveable segment, the second side being opposite the first side of the moveable segment with respect to the pedestal, wherein the second magnet is positioned such that a polar orientation of the second magnet with respect to the moveable segment is opposite a polar orientation of the first magnet with respect to the moveable segment; and a sensing element configured to measure a deflection of the first magnet along an axis, wherein the gradiometer directly measures a gradient of the external magnetic field based on the deflection of the first magnet with respect to the sensing element.

14. The gradiometer of claim 13, wherein the sensing element is positioned along the axis and offset from the magnet.

15. The gradiometer of claim 13, further comprising at least one additional magnet positioned on the first side of the moveable segment adjacent the first magnet.

16. The gradiometer of claim 13, further comprising at least one additional magnet attached to the first magnet at like magnetic poles and positioned along the moveable segment to move along the axis.

17. The gradiometer of claim 13, wherein the moveable segment extends generally in a plane, and the sensing element is configured to measure the deflection of the first magnet in a direction orthogonal to the plane.

18. The gradiometer of claim 13, wherein the gradiometer is configured to measure a change in the gradient of the magnetic field.

19. The gradiometer of claim 18, wherein the change in the gradient of the magnetic field is a second order gradient.

20. The gradiometer of claim 19, wherein the change in the gradient of the magnetic field is a higher-than-second order gradient.

21. The gradiometer of claim 13, wherein the moveable segment is at least one of: a plate; or a beam.

* * * * *